(12) United States Patent
Oda et al.

(10) Patent No.: US 9,758,694 B2
(45) Date of Patent: Sep. 12, 2017

(54) CURABLE RESIN COMPOSITION, CURED PRODUCT THEREOF, AND SEMICONDUCTOR DEVICE USING THE SAME

(71) Applicant: Central Glass Company, Limited, Ube-Shi, Yamaguchi (JP)

(72) Inventors: Masafumi Oda, Saitama (JP); Junya Nakatsuji, Saitama (JP); Yutaka Sugita, Saitama (JP); Tsuyoshi Ogawa, Saitama (JP)

(73) Assignee: Central Glass Company, Limited, Ube-shi (JP)

( * ) Notice: Subject to any disclaimer, the term of this patent is extended or adjusted under 35 U.S.C. 154(b) by 0 days.

(21) Appl. No.: 15/006,796

(22) Filed: Jan. 26, 2016

(65) Prior Publication Data
US 2016/0215168 A1 Jul. 28, 2016

(30) Foreign Application Priority Data
Jan. 26, 2015 (WO) .................. PCT/JP2015/051959

(51) Int. Cl.
| | | |
|---|---|---|
| C09D 183/04 | (2006.01) | |
| H01L 23/29 | (2006.01) | |
| C08K 3/36 | (2006.01) | |
| C08G 77/04 | (2006.01) | |
| C08G 77/00 | (2006.01) | |
| H01L 21/56 | (2006.01) | |
| H01L 23/495 | (2006.01) | |
| C08G 77/16 | (2006.01) | |
| C08G 77/18 | (2006.01) | |
| H01L 23/31 | (2006.01) | |

(52) U.S. Cl.
CPC ........... *C09D 183/04* (2013.01); *C08G 77/04* (2013.01); *C08G 77/16* (2013.01); *C08G 77/18* (2013.01); *C08G 77/80* (2013.01); *C08K 3/36* (2013.01); *H01L 21/56* (2013.01); *H01L 23/295* (2013.01); *H01L 23/296* (2013.01); *H01L 23/49562* (2013.01); *H01L 23/3121* (2013.01); *H01L 23/4952* (2013.01); *H01L 23/49503* (2013.01); *H01L 23/49568* (2013.01); *H01L 2224/48091* (2013.01); *H01L 2224/48227* (2013.01); *H01L 2224/48247* (2013.01); *H01L 2224/73265* (2013.01); *H01L 2924/0002* (2013.01); *H01L 2924/19107* (2013.01)

(58) Field of Classification Search
None
See application file for complete search history.

(56) References Cited

U.S. PATENT DOCUMENTS

| | | |
|---|---|---|
| 3,826,773 A | 7/1974 | Cooke, Jr. |
| 7,381,784 B2 | 6/2008 | Nakayama |
| 7,807,736 B2 | 10/2010 | Kashiwagi et al. |
| 8,318,854 B2 | 11/2012 | Katayama et al. |
| 8,629,222 B2 | 1/2014 | Takizawa et al. |
| 9,153,755 B2 | 10/2015 | Kimura et al. |
| 2006/0135723 A1 | 6/2006 | Nakayama |
| 2008/0021136 A1 | 1/2008 | Kashiwagi et al. |
| 2010/0148378 A1 | 6/2010 | Katayama et al. |
| 2011/0065872 A1* | 3/2011 | Taguchi .................. C08L 83/04 525/478 |
| 2011/0098420 A1 | 4/2011 | Takizawa et al. |
| 2011/0301276 A1 | 12/2011 | Katayama et al. |
| 2013/0092974 A1 | 4/2013 | Kimura et al. |

FOREIGN PATENT DOCUMENTS

| | | |
|---|---|---|
| EP | 2 336 230 A1 | 6/2011 |
| JP | 2005-146191 A | 6/2005 |
| JP | 2008-27966 A | 2/2008 |
| JP | 2009-256670 A | 11/2009 |
| JP | 2010-285593 A | 12/2010 |
| JP | 2011-162741 A | 8/2011 |
| JP | 2011-219729 A | 11/2011 |
| JP | 2012-12563 A | 1/2012 |
| JP | 2012-184353 A | 9/2012 |
| JP | 2012-251166 A | 12/2012 |
| JP | 2013-136671 A | 7/2013 |
| JP | 2014-9336 A | 1/2014 |
| WO | WO 2004/072150 A1 | 8/2004 |
| WO | WO 2010/090280 A1 | 8/2010 |

OTHER PUBLICATIONS

Machine translation for the Korean-language Office action issued in counterpart Korean Application No. 10-2016-0008677.*
Extended European Search Report issued in counterpart European Application No. 16152642.1 dated Jun. 7, 2016 (five (5) pages).
Japanese-language International Search Report (PCT/ISA/210) issued in PCT Application No. PCT/JP2015/051959 dated Feb. 17, 2015 with partial English-language translation (four (4) pages).
Japanese-language Written Opinion (PCT/ISA/237) issued in PCT Application No. PCT/JP2015/051959 dated Feb. 17, 2015 (three (3) pages).

(Continued)

*Primary Examiner* — Marc Zimmer
(74) *Attorney, Agent, or Firm* — Crowell & Moring LLP

(57) ABSTRACT

According to one aspect of the present invention, there is provided a curable resin composition including at least: a polysiloxane compound having, in a molecule thereof, at least two functional groups selected from the group consisting of silanol groups and alkoxysilyl groups as a component (A-1); and silica whose extract water has a pH of 6.1 or lower at 25° C. as a component (B), wherein the amount of the component (B) relative to the total amount of the components (A-1) and (B) is in a range of 70 to 97 mass %. This curable resin composition is able to, even when formed into various shapes and sizes, prevent foaming during curing and thus is suitable as an encapsulant material for a semiconductor element.

56 Claims, 1 Drawing Sheet

(56) References Cited

OTHER PUBLICATIONS

English-language translation of document C2 (Japanese-language Written Opinion (PCT/ISA/237) issued in PCT Application No. PCT/JP2015/051959 dated Feb. 17, 2015) previously filed on Jan. 26, 2016 (two (2) pages).
Korean-language Office Action issued in counterpart Korean Application No. 10-2016-0008677 dated Nov. 21, 2016 (Nine (9) pages).

* cited by examiner

CURABLE RESIN COMPOSITION, CURED PRODUCT THEREOF, AND SEMICONDUCTOR DEVICE USING THE SAME

FIELD OF THE INVENTION

The present invention relates to a curable resin composition suitable as a raw material of encapsulants for semiconductor elements, especially power semiconductor elements, a cured product of the curable resin composition and a semiconductor device using the curable resin composition or cured product.

BACKGROUND OF THE INVENTION

There is a tendency that the amount of heat generated by semiconductor devices increases with improvement in the functionality and performance of electronic equipment. In particular, power semiconductor devices for power and supply control are required to achieve high-voltage and large-current characteristics. Devices having mounted thereon silicon carbide (SiC) semiconductor elements, gallium nitride (GaN) semiconductor elements etc. are expected as the next-generation power semiconductor devices. It is assumed that the full potential of these devices are exploited by stable operations at about 250° C. Under such circumstances, the heat-resistant temperature required of peripheral components such as encapsulants are becoming high.

Conventionally, epoxy resin compositions are used as raw materials of encapsulants for power semiconductor elements. It is generally known that cured products of epoxy resin compositions, when left for a long time under temperature conditions of 150° C. or higher, show deteriorations in weight and mechanical strength. Various studies have thus been made to improve the heat resistance of cured epoxy resin products. For example, Japanese Laid-Open Patent Application Publication No. 2014-9936 discloses an epoxy resin-containing cured product applicable up to temperatures near 180° C. However, the heat resistance of this cured product is not yet sufficient as required for the operations of SiC and GaN power semiconductor devices at about 250° C.

Silicone resin compositions are also widely used as encapsulants for power semiconductor elements. As methods for obtaining cured products of silicon resin compositions, there are known a method using hydrosilylation between a hydrosilyl group and an alkenyl group (see, for example, Japanese Laid-Open Patent Application Publication No. 2008-27966 and No. 2005-146191), a method using polymerization reaction by a reactive functional group such as epoxy group (see, for example, International Patent Application Publication No. 2004/072150) and the like. In these methods, however, the cross linkages of the cured products are poor in thermal stability so that the cured products are not always suitable for uses where the cured products are required to have heat resistance at about 250° C. for a long time.

As another curing method, there is also known a method using so-called condensation and, more specifically, at least one of dehydration condensation between silanol groups, dealcoholization condensation between a silanol group and an alkoxysilyl group and dehydrocondensation of a silanol group and a hydrosilyl group. Polysiloxane compounds usable as raw materials for the production of cured products by such a condensation curing method are called condensation type polysiloxane compounds. It is known that cured products of condensation type polysiloxane compounds have both main chain and cross-linkage structures constituted only by chemically stable siloxane bond and thus show very high heat resistance. Further, the condensation curing method enables forming and curing at temperatures of 200° C. or lower and thus can suitably be utilized for encapsulation of semiconductor elements with heat-sensitive components. It is consequently possible to attain high material selectivity by the condensation curing of condensation type polysiloxane compounds as compared to the case of using the other heat-resistant materials such as ordinary polyimide resin and molten glass that need to be subjected to forming and curing at temperatures exceeding 200° C. However, the condensation curing method has the problem of the occurrence of foaming in the cured product by generation of gas (water, alcohol and/or hydrogen) during curing. The foaming is regarded as a problem since the occurrence of foaming leads to deteriorations in the adhesion, mechanical strength, gas barrier function and insulating property of the cured product. It is essentially difficult to solve such a foaming problem due to the nature of the condensation reaction.

Various studies have been made to suppress the occurrence of foaming in cured products of condensation type polysiloxane compositions. For example, Japanese Laid-Open Patent Application Publication No. 2009-256670 discloses a condensation type polysiloxane composition capable of being formed into a cured product with an average thickness of 1.2 mm or smaller. It is discussed in this patent publication that the occurrence of foaming in the cured product can be reduced by decreasing the film thickness of the composition. Furthermore, Japanese Laid-Open Patent Application Publication No. 2011-219729 discloses a condensation type polysiloxane composition containing polydimethylsiloxane having two silanol groups bonded to both terminal ends thereof. In this composition, the condensation site of the polysiloxane is decreased so as to control the thickness of the cured product to 1 mm or smaller reducing the amount of gas generation during curing.

SUMMARY OF THE INVENTION

As mentioned above, cured products of condensation type polysiloxane compositions are expected to be useful as encapsulants for SiC and GaN power semiconductor elements. By forming a film of condensation type polysiloxane composition and curing the resulting polysiloxane composition film, it is feasible to suppress the occurrence of foaming in the cured product. It is however very difficult to suppress the occurrence of foaming at the time of producing a cured product of condensation type polysiloxane composition in bulk form of greater than predetermined thickness and size. Although the thickness and size required of cured products as encapsulants for power semiconductor elements vary, there are many cured products available in thicknesses of 4 mm or greater and width and length dimensions of 10 mm or greater for use as semiconductor encapsulants. Accordingly, there is a limit on the application of cured products of condensation type polysiloxane compositions for use as encapsulants.

The present invention has been made in view of the above circumstances. It is an object of the present invention to provide a condensation curable resin composition, even when formed into various shapes and sizes, free of the occurrence of foaming during curing. It is also an object of the present invention to provide a cured product of the curable resin composition and a semiconductor device using the cured product.

As a result of extensive researches, the present inventors have found that it is possible to achieve the above object by the use of a curable resin composition containing at least a specific polysiloxane compound as a component (A) and silica whose extract water has a pH of 6.1 or lower at 25° C. as a component (B) such that the amount of the component (B) relative to the total amount of the components (A) and (B) is in the range of 70 to 97 mass %. Based on this finding, the present inventors have accomplished a condensation curable resin composition, even when formed into various shapes and sizes, free of the occurrence of foaming during curing Namely, the present invention provides a curable resin composition free of the occurrence of foaming during curing even when formed into various shapes and sizes. The present invention also provides a cured product of the curable resin composition and a semiconductor device using the curable resin composition or cured product.

More specifically, the present invention includes the following inventive aspects.

[Inventive Aspect 1]

A curable resin composition comprising at least:

component (A-1): a polysiloxane compound having, in a molecule thereof, at least two functional groups selected from the group consisting of silanol groups and alkoxysilyl groups; and component (B): silica whose extract water has a pH of 6.1 or lower at 25° C., wherein the amount of the component (B) relative to the total amount of the components (A-1) and (B) is in a range of 70 to 97 mass %.

[Inventive Aspect 2]

The curable resin composition according to Inventive Aspect 1, wherein the polysiloxane compound contained as the component (A-1) contains has at least a structural unit of the general formula [1]

$$[R^1{}_m SiO_{n/2}] \qquad [1]$$

where $R^1$ each independently represents a hydrogen atom, a $C_1$-$C_{10}$ linear alkyl group, a $C_3$-$C_{10}$ branched alkyl group, a $C_3$-$C_{10}$ cyclic alkyl group, a $C_2$-$C_{10}$ linear alkenyl group, a $C_3$-$C_{10}$ branched alkenyl group, a $C_3$-$C_{10}$ cyclic alkenyl group or a $C_5$-$C_{10}$ aryl group; a part or all of hydrogen atoms of the alkyl group, the alkenyl group or the aryl group may be substituted by a halogen atom; a part of carbon atoms of the alkyl group, the alkenyl group or the aryl group may be replaced by at least one kind selected from the group consisting of a nitrogen atom, an oxygen atom and a silicon atom; the halogen atom is at least one kind selected from the group consisting of a fluorine atom, a chlorine atom, a bromine atom and an iodine atom; when there are a plurality of $R^1$, $R^1$ can be of the same kind or different kinds; an oxygen atom of the structural unit of the general formula [1] is a siloxane bond-forming oxygen atom or a hydroxyl oxygen atom; and m and n each independently represent an integer of 1 to 4 and satisfy a relationship of m+n=4.

[Inventive Aspect 3]

The curable resin composition according to Inventive Aspect 2, wherein $R^1$ is a $C_1$-$C_{10}$ linear alkyl group, a $C_3$-$C_{10}$ branched alkyl group, a $C_3$-$C_{10}$ cyclic alkyl group or a $C_5$-$C_{10}$ aryl group.

[Inventive Aspect 4]

The curable resin composition according to Inventive Aspect 2, wherein $R^1$ is a methyl group or a phenyl group.

[Inventive Aspect 5]

The curable resin composition according to any one of Inventive Aspects 2 to 4, wherein the polysiloxane compound contained as the component (A-1) has the structural unit of the general formula [1] and a structural unit of the general formula [2]

$$[SiO_{4/2}] \qquad [2]$$

where an oxygen atom of the structural unit of the general formula [2] is a siloxane bond-forming oxygen atom or a hydroxyl oxygen atom.

[Inventive Aspect 6]

A curable resin composition comprising at least:

component (A-2): a polysiloxane compound obtained by hydrolysis and polycondensation of at least one kind of alkoxysilane compound of the general formula [3]

$$(R^1)_y Si(OR^2)_{4-y} \qquad [3]$$

where $R^1$ each independently represents a hydrogen atom, a $C_1$-$C_{10}$ linear alkyl group, a $C_3$-$C_{10}$ branched alkyl group, a $C_3$-$C_{10}$ cyclic alkyl group, a $C_2$-$C_{10}$ linear alkenyl group, a $C_3$-$C_{10}$ branched alkenyl group, a $C_3$-$C_{10}$ cyclic alkenyl group or a $C_5$-$C_{10}$ aryl group; a part or all of hydrogen atoms of the alkyl group, the alkenyl group or the aryl group may be substituted by a halogen atom; a part of carbon atoms of the alkyl group, the alkenyl group or the aryl group may be replaced by at least one kind selected from the group consisting of a nitrogen atom, an oxygen atom and a silicon atom; the halogen atom is at least one kind selected from the group consisting of a fluorine atom, a chlorine atom, a bromine atom and an iodine atom; when there are a plurality of $R^1$, $R^1$ can be of the same kind or different kinds; $R^2$ each independently represents a $C_1$-$C_4$ linear alkyl group or a $C_3$-$C_4$ branched alkyl group; when there are a plurality of $R^2$, $R^2$ can be of the same kind or different kinds; and y represents an integer of 1 to 3; and component (B): silica whose extract water has a pH of 6.1 or lower at 25° C., wherein the amount of the component (B) relative to the total amount of the components (A-2) and (B) is in a range of 70 to 97 mass %.

[Inventive Aspect 7]

The curable resin composition according to Inventive Aspect 6, wherein $R^1$ is a $C_1$-$C_{10}$ linear alkyl group, a $C_3$-$C_{10}$ branched alkyl group, a $C_3$-$C_{10}$ cyclic alkyl group or a $C_5$-$C_{10}$ aryl group.

[Inventive Aspect 8]

The curable resin composition according to Inventive Aspect 6, wherein $R^1$ is a methyl group or a phenyl group.

[Inventive Aspect 9]

The curable resin composition according to any one of Inventive Aspects 6 to 8, wherein the polysiloxane compound contained as the component (A-2) is a polysiloxane compound obtained by hydrolysis and polycondensation of at least one kind of alkoxysilane compound of the general formula [3] and at least one kind of alkoxysilane compound of the general formula [4]

$$Si(OR^2)_4 \qquad [4]$$

where $R^2$ each independently represents a $C_1$-$C_4$ linear alkyl group or a $C_3$-$C_4$ branched alkyl group; and, when there are a plurality of $R^2$, $R^2$ can be of the same kind or different kinds.

[Inventive Aspect 10]

The curable resin composition according to any one of Inventive Aspects 1 to 5, wherein the total amount of silanol and alkoxysilyl groups in the component (A-1) is in a range of 1 to 15 mmol/g.

[Inventive Aspect 11]

The curable resin composition according to any one of Inventive Aspects 6 to 9, wherein the total amount of silanol and alkoxysilyl groups in the component (A-2) is in a range of 1 to 15 mmol/g.

[Inventive Aspect 12]

The curable resin composition according to any one of Inventive Aspects 1 to 11, wherein the component (B) contains two or more kinds of silica.

[Inventive Aspect 13]

The curable resin composition according to Inventive Aspect 12, wherein the two or more kinds of silica are selected from the group consisting of crystalline silica, natural fused silica, synthetic fused silica, deflagration silica, fumed silica, sol-gel silica, flame fused silica and precipitated silica.

[Inventive Aspect 14]

The curable resin composition according to any one of Inventive Aspects 1 to 13, wherein the silica contained as the component (B) has a median particle size of 0.02 to 500 μm.

[Inventive Aspect 15]

The curable resin composition according to any one of Inventive Aspects 1 to 14, wherein the silica contained as the component (B) shows a plurality of frequency peaks in particle size distribution analysis.

[Inventive Aspect 16]

The curable resin composition according to any one of Inventive Aspects 1 to 15, wherein the silica contained as the component (B) includes silica particles having a particle size of 3 μm or smaller.

[Inventive Aspect 17]

The curable resin composition according to any one of Inventive Aspects 1 to 16, wherein the silica contained as the component (B) is chemically unmodified.

[Inventive Aspect 18]

The curable resin composition according to any one of Inventive Aspects 1 to 17, further comprising at least one kind selected from the group consisting of an inorganic filler, a heat-resistant resin, a mold release agent, a pigment, a flame retardant, a curing catalyst and an anti-blocking agent.

[Inventive Aspect 19]

The curable resin composition according to Inventive Aspect 18, wherein the inorganic filler is at least one kind selected from the group consisting of silica different from the silica contained as the component (B), alumina, titania, zirconia, clay mineral, glass, zinc oxide, boron nitride, aluminum nitride, calcium carbonate, magnesium carbonate, zirconium phosphate, zirconium phosphate tungstate and carbon isotope.

[Inventive Aspect 20]

The curable resin composition according to Inventive Aspect 18, wherein the heat-resistant resin is at least one kind selected from the group consisting of nanocellulose, aramid fiber, carbon fiber, PEEK resin and polyimide.

[Inventive Aspect 21]

The curable resin composition according to Inventive Aspect 18, wherein the mold release agent is at least one kind selected from the group consisting of Candellia wax, Carnauba wax, Rice wax, Montana wax, paraffin wax, synthetic wax, tetrafluoroethylene resin, tetrafluoroethylene-perfluoroalkoxyethyelene copolymer resin, tetrafluoroethylene-hexafluoropropylene copolymer resin, tetrafluoroethylene-ethylene copolymer resin, vinylidene fluoride resin, dimethylsilicone and fluorosilicone.

[Inventive Aspect 22]

The curable resin composition according to Inventive Aspect 18, wherein the pigment is at least one kind selected from the group consisting of carbon black, hydrozincite, white lead, lithopone, titanium dioxide, precipitated barium sulfate, barite powder, red lead, red iron oxide, chrome yellow, zinc yellow, ultramarine blue, prussian blue, phthalocyanine, polycyclic pigment and azo pigment.

[Inventive Aspect 23]

The curable resin composition according to Inventive Aspect 18, wherein the flame retardant is at least one kind selected from the group consisting of a halogen flame retardant, a phosphorus flame retardant, a metal hydroxide flame retardant and an antimony flame retardant.

[Inventive Aspect 24]

The curable resin composition according to Inventive Aspect 18, wherein the curing catalyst is an acid catalyst, a base catalyst or a metal complex catalyst.

[Inventive Aspect 25]

The curable resin composition according to Inventive Aspect 24, wherein the acid catalyst is at least one kind selected from the group consisting of acetic acid, propionic acid, trifluoroacetic acid, methanesulfonic acid, trifluoromethanesulfonic acid, formic acid, oxalic acid, maleic acid, camphorsulfonic acid, benzenesulfonic acid, tosic acid, hydrochloric acid, sulfuric acid, nitric acid, phosphoric acid and boric acid.

[Inventive Aspect 26]

The curable resin composition according to Inventive Aspect 24, wherein the base catalyst is at least one kind selected from the group consisting of 1,8-diazabicyclo[5.4.0]undec-7-ene, diethylamine, triethylamine, imidazole, pyridine, triphenylphosphine, sodium hydroxide, potassium hydroxide, lithium hydroxide, magnesium hydroxide, sodium carbonate, potassium carbonate, cesium carbonate and sodium hydrocarbonate.

[Inventive Aspect 27]

The curable resin composition according to Inventive Aspect 24, wherein the metal complex catalyst is at least one kind selected from the group consisting of zinc octoate, zinc benzoate, zinc p-tert-butylbenzoate, zinc laurate, zinc stearate, aluminum chloride, aluminum perchlorate, aluminum phosphate, aluminum triisopropoxide, aluminum acetylacetonate, aluminum butoxybisethylacetoacetate, tetrabutyl titanate, tetraisopropyl titanate, tin octoate, tin naphthenate and cobalt naphthenate.

[Inventive Aspect 28]

The curable resin composition according to Inventive Aspect 18, wherein the anti-blocking agent is at least one kind selected from the group consisting of lauric acid, myristic acid, palmitic acid, margaric acid, stearic acid, arachidic acid, behenic acid, Li salt of stearic acid, Na salt of stearic acid, Mg salt of stearic acid, K salt of stearic acid, Ca salt of stearic acid, Ba salt of stearic acid, Al salt of stearic acid, Zn salt of stearic acid, Fe salt of stearic acid, Ca salt of lauric acid, Ba salt of lauric acid, Zn salt of lauric acid, Ca salt of behenic acid, Ba salt of behenic acid, Zn salt of behenic acid, Ca salt of 12-hydroxystearic acid, Mg salt of 12-hydroxystearic acid, Zn salt of 12-hydroxystearic acid, aluminum silicate, crystalline silica, natural fused silica, synthetic fused silica, deflagration silica, fumed silica, sol-gel silica, flame fused silica, precipitated silica, zeolite, talc, kaolin, diatomite, polyethylene beads, polytetrafluoroethylene, polymethyl methacrylate, acrylic resin and silicon resin.

[Inventive Aspect 29]

The curable resin composition according to Inventive Aspect 18, further comprising a coupling agent.

[Inventive Aspect 30]

The curable resin composition according to Inventive Aspect 29, wherein the coupling agent is at least one kind selected from the group consisting of methyltrimethoxysilane, methyltriethoxysilane, phenyltrimethoxysilane, phenyltriethoxysilane, ethyltrimethoxysilane, propyltrimethoxysilane, isopropyltrimethoxysilane, trifluoromethyltrimethoxysilane, pentafluoromethyltrimethoxysilane, 3,3,3-trifluoropropyltrimethoxysilane, vinyltrimethoxysilane, 2-(3,4-epoxycyclohexyl)ethyltrimethoxysilane, 3-glycidoxypropyltrimethoxysilane, 3-methacryloxypropyltrimethoxysilane, 3-aminopropyltrimethoxysilane, tris(trimethoxysilylpropyl)isocyanurate and 3-isocyanatepropyltriethoxysilane.

[Inventive Aspect 31]

The curable resin composition according to any one of Inventive Aspects 1 to 30, wherein the curable resin composition has a spiral flow length of 5 to 180 cm as determined according to Japan Electrical Insulating and Advanced Performance Materials Industrial Association Standard T901 under the conditions of a temperature of 180° C., a molding pressure of 6.9 MPa and a molding time of 3 minutes.

[Inventive Aspect 32]

A preparation method of a curable resin composition,
the curable resin composition comprising at least:
component (A-1): a polysiloxane compound having, in a molecule thereof, at least two functional groups selected from the group consisting of silanol groups and alkoxysilyl groups, or component (A-2): a polysiloxane compound obtained by hydrolysis and polycondensation of at least one kind of alkoxysilane compound of the general formula [3]

$(R^1)_y Si(OR^2)_{4-y}$ [3]

where $R^1$ each independently represents a hydrogen atom, a $C_1$-$C_{10}$ linear alkyl group, a $C_3$-$C_{10}$ branched alkyl group, a $C_3$-$C_{10}$ cyclic alkyl group, a $C_2$-$C_{10}$ linear alkenyl group, a $C_3$-$C_{10}$ branched alkenyl group, a $C_3$-$C_{10}$ cyclic alkenyl group or a $C_5$-$C_{10}$ aryl group; a part or all of hydrogen atoms of the alkyl group, the alkenyl group or the aryl group may be substituted by a halogen atom; a part of carbon atoms of the alkyl group, the alkenyl group or the aryl group may be replaced by at least one kind selected from the group consisting of a nitrogen atom, an oxygen atom and a silicon atom; the halogen atom is at least one kind selected from the group consisting of a fluorine atom, a chlorine atom, a bromine atom and an iodine atom; when there are a plurality of $R^1$, $R^1$ can be of the same kind or different kinds; $R^2$ each independently represents a $C_1$-$C_4$ linear alkyl group or a $C_3$-$C_4$ branched alkyl group; when there are a plurality of $R^2$, $R^2$ can be of the same kind or different kinds; and y represents an integer of 1 to 3; and component (B): silica whose extract water has a pH of 6.1 or lower at 25° C., the preparation method comprising mixing the component (A-1) or (A-2) with the component (B) such that the amount of the component (B) relative to the total amount of the component (A-1) or (A-2) and the component (B) is in a range of 70 to 97 mass %.

[Inventive Aspect 33]

The preparation method according to Inventive Aspect 32, wherein two or more kinds of silica are mixed together in advance and used as the component (B).

[Inventive Aspect 34]

The preparation method according to Inventive Aspect 33, wherein the two or more kinds of silica are selected from the group consisting of crystalline silica, natural fused silica, synthetic fused silica, deflagration silica, fumed silica, sol-gel silica, flame fused silica and precipitated silica.

[Inventive Aspect 35]

The preparation method according to any one of Inventive Aspects 32 to 34, wherein the silica contained as the component (B) has a median particle size of 0.02 to 500 μm.

[Inventive Aspect 36]

The preparation method according to any one of Inventive Aspects 32 to 35, wherein the silica contained as the component (B) shows a plurality of frequency peaks in particle size distribution analysis.

[Inventive Aspect 37]

The preparation method according to any one of Inventive Aspects 32 to 36, wherein the silica contained as the component (B) includes silica particles having a particle size of 3 μm or smaller.

[Inventive Aspect 38]

The preparation method according to any one of Inventive Aspects 32 to 37, wherein the silica contained as the component (B) is chemically unmodified.

[Inventive Aspect 39]

The preparation method according to any one of Inventive Aspects 32 to 38, wherein the curable resin composition is prepared by mixing the component (A-1) or (A-2), the component (B) and at least one kind selected from the group consisting of an inorganic filler, a heat-resistant resin, a mold release agent, a pigment, a flame retardant, a curing catalyst and an anti-blocking agent.

[Inventive Aspect 40]

The preparation method according to any one of Inventive Aspects 32 to 38, wherein the curable resin composition is prepared by mixing the component (A-1) or (A-2), the component (B), at least one kind selected from the group consisting of an inorganic filler, a heat-resistant resin, a mold release agent, a pigment, a flame retardant, a curing catalyst and an anti-blocking agent, and a coupling agent.

[Inventive Aspect 41]

The preparation method according to Inventive Aspect 39 or 40, wherein the inorganic filler is at least one kind selected from the group consisting of silica different from the silica contained as the component (B), alumina, titania, zirconia, clay mineral, glass, zinc oxide, boron nitride, aluminum nitride, calcium carbonate, magnesium carbonate, zirconium phosphate, zirconium phosphate tungstate and carbon isotope.

[Inventive Aspect 42]

The preparation method according to Inventive Aspect 39 or 40, wherein the heat-resistant resin is at least one kind selected from the group consisting of nanocellulose, aramid fiber, carbon fiber, PEEK resin and polyimide.

[Inventive Aspect 43]

The preparation method according to Inventive Aspect 39 or 40, wherein the mold release agent is at least one kind selected from the group consisting of Candellia wax, Carnauba wax, Rice wax, Montana wax, paraffin wax, synthetic wax, tetrafluoroethylene resin, tetrafluoroethylene-perfluoroalkoxyethyelene copolymer resin, tetrafluoroethylene-hexafluoropropylene copolymer resin, tetrafluoroethylene-ethylene copolymer resin, vinylidene fluoride resin, dimethyl silicone and fluorosilicone.

[Inventive Aspect 44]

The preparation method according to Inventive Aspect 39 or 40, wherein the pigment is at least one kind selected from the group consisting of carbon black, hydrozincite, white lead, lithopone, titanium dioxide, precipitated barium sulfate, barite powder, red lead, red iron oxide, chrome yellow, zinc yellow, ultramarine blue, prussian blue, phthalocyanine, polycyclic pigment and azo pigment.

[Inventive Aspect 45]

The preparation method according to Inventive Aspect 39 or 40, wherein the flame retardant is at least one kind selected from the group consisting of a halogen flame retardant, a phosphorus flame retardant, a metal hydroxide flame retardant and an antimony flame retardant.

[Inventive Aspect 46]

The preparation method according to Inventive Aspect 39 or 40, wherein the curing catalyst is an acid catalyst, a base catalyst or a metal complex catalyst.

[Inventive Aspect 47]

The preparation method according to Inventive Aspect 46, wherein the acid catalyst is at least one kind selected from the group consisting of acetic acid, propionic acid, trifluoroacetic acid, methanesulfonic acid, trifluoromethanesulfonic acid, formic acid, oxalic acid, maleic acid, camphorsulfonic acid, benzenesulfonic acid, tosic acid, hydrochloric acid, sulfuric acid, nitric acid, phosphoric acid and boric acid.

[Inventive Aspect 48]

The preparation method according to Inventive Aspect 46, wherein the base catalyst is at least one kind selected from the group consisting of 1,8-diazabicyclo[5.4.0]undec-7-ene, diethylamine, triethylamine, imidazole, pyridine, triphenylphosphine, sodium hydroxide, potassium hydroxide, lithium hydroxide, magnesium hydroxide, sodium carbonate, potassium carbonate, cesium carbonate and sodium hydrocarbonate.

[Inventive Aspect 49]

The preparation method according to Inventive Aspect 46, wherein the metal complex catalyst is at least one kind selected from the group consisting of zinc octoate, zinc benzoate, zinc p-tert-butylbenzoate, zinc laurate, zinc stearate, aluminum chloride, aluminum perchlorate, aluminum phosphate, aluminum triisopropoxide, aluminum acetylacetonate, aluminum butoxybisethylacetoacetate, tetrabutyl titanate, tetraisopropyl titanate, tin octoate, tin naphthenate and cobalt naphthenate.

[Inventive Aspect 50]

The preparation method according to Inventive Aspect 39 or 40, wherein the anti-blocking agent is at least one kind selected from the group consisting of lauric acid, myristic acid, palmitic acid, margaric acid, stearic acid, arachidic acid, behenic acid, Li salt of stearic acid, Na salt of stearic acid, Mg salt of stearic acid, K salt of stearic acid, Ca salt of stearic acid, Ba salt of stearic acid, Al salt of stearic acid, Zn salt of stearic acid, Fe salt of stearic acid, Ca salt of lauric acid, Ba salt of lauric acid, Zn salt of lauric acid, Ca salt of behenic acid, Ba salt of behenic acid, Zn salt of behenic acid, Ca salt of 12-hydroxystearic acid, Mg salt of 12-hydroxystearic acid, Zn salt of 12-hydroxystearic acid, aluminum silicate, crystalline silica, natural fused silica, synthetic fused silica, deflagration silica, fumed silica, sol-gel silica, flame fused silica, precipitated silica, zeolite, talc, kaolin, diatomite, polyethylene beads, polytetrafluoroethylene, polymethyl methacrylate, acrylic resin and silicon resin.

[Inventive Aspect 51]

The preparation method according to Inventive Aspect 40, wherein the coupling agent is at least one kind selected from the group consisting of methyltrimethoxysilane, methyltriethoxysilane, phenyltrimethoxysilane, phenyltriethoxysilane, ethyltrimethoxysilane, propyltrimethoxysilane, isopropyltrimethoxysilane, trifluoromethyltrimethoxysilane, pentafluoromethyltrimethoxysilane, 3,3,3-trifluoropropyltrimethoxysilane, vinyltrimethoxysilane, 2-(3,4-epoxycyclohexyl)ethyltrimethoxysilane, 3-glycidoxypropyltrimethoxysilane, 3-methacryloxypropyltrimethoxysilane, 3-aminopropyltrimethoxysilane, tris(trimethoxysilylpropyl) isocyanurate and 3-isocyanatepropyltriethoxysilane.

[Inventive Aspect 52]

The preparation method according to any one of Inventive Aspects 32 to 51, wherein the curable resin composition has a spiral flow length of 5 to 180 cm as determined according to Japan Electrical Insulating and Advanced Performance Materials Industrial Association Standard T901 under the conditions of a temperature of 180° C., a molding pressure of 6.9 MPa and a molding time of 3 minutes.

[Inventive Aspect 53]

A tableted product of the curable resin composition according to any one of Inventive Aspects 1 to 31.

[Inventive Aspect 54]

A cured product of the curable resin composition according to any one of Inventive Aspects 1 to 31.

[Inventive Aspect 55]

The cured product according to Inventive Aspect 54, wherein the cured product is obtained by subjecting the curable resin composition to forming.

[Inventive Aspect 56]

The cured product according to Inventive Aspect 54 or 55, wherein the cured product is obtained by subjecting the curable resin composition to cast molding, compression molding or transfer molding.

[Inventive Aspect 57]

The cured product according to any one of Inventive Aspects 54 to 56, wherein the curable resin composition is used in tablet form and subjected to transfer molding.

[Inventive Aspect 58]

The cured product according to any one of Inventive Aspects 54 to 57, wherein the cured product has a thickness of 1 mm or greater.

[Inventive Aspect 59]

The cured product according to any one of Inventive Aspects 54 to 58, wherein the cured product has a thickness of 2 mm or greater.

[Inventive Aspect 60]

The cured product according to any one of Inventive Aspects 54 to 59, wherein the cured product has a thickness of 4 mm or greater.

[Inventive Aspect 61]

An encapsulant for a semiconductor element, comprising the cured product according to any one of Inventive Aspects 54 to 60.

[Inventive Aspect 62]

A semiconductor device comprising at least a semiconductor element encapsulated by the cured product according to any one of Inventive Aspects 54 to 60.

[Inventive Aspect 63]

The semiconductor device according to Inventive Aspect 62, wherein the semiconductor element is a power semiconductor element.

[Inventive Aspect 64]

A method of encapsulating a semiconductor element, comprising curing the curable resin composition according to any one of Inventive Aspects 1 to 31.

[Inventive Aspect 65]

Use of the curable resin composition according to any one of Inventive Aspects 1 to 31 for encapsulating a semiconductor element by curing the curable resin composition.

[Inventive Aspect 66]

The curable resin composition according to any one of Inventive Aspects 1 to 31, wherein the curable resin composition is a curable resin composition for encapsulating a semiconductor element.

The curable resin composition of the present invention is, even when formed into various shapes and sizes, free of the occurrence of foaming during curing and thus is suitable as an encapsulant material for a semiconductor element and, more specifically, an encapsulant for a power semiconductor element.

DESCRIPTION OF EMBODIMENTS

Figure 1:
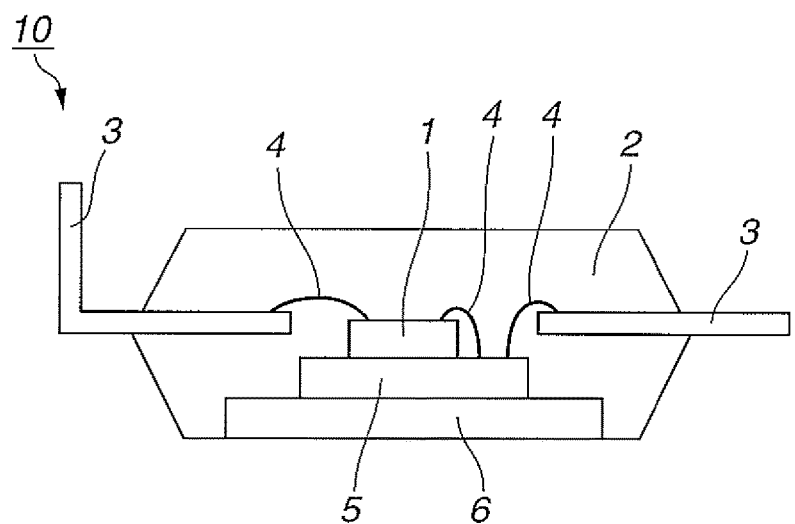
FIG. 1 is a schematic section view of a semiconductor device according to one embodiment of the present invention.

The present invention will be described in detail below. It should be herein noted that: the technical scope of the present invention is defined with reference to the following claims; and the present invention is not limited to the following embodiments.

[Curable Resin Composition]

According to the present invention, there is provided a curable resin composition containing at least a specific polysiloxane compound as a component (A) and a specific silica as a component (B). The curable resin composition of the present invention may contain a specific additive as an additional component.

In the first embodiment of the present invention, the curable resin composition contains the after-mentioned component (A-1) as the component (A). On the other hand, the curable resin composition contains the after-mentioned component (A-2) as the component (A). In the present specification, features common to the components (A-1) and (A-2) will be explained as features of the component (A).

Hereinafter, the respective components of the curable resin composition of the present invention will be explained in detail below.

<Component (A): Polysiloxane Compound>
(First Embodiment)

The component (A-1) is a polysiloxane compound having, in a molecule thereof, at least two functional groups selected from the group consisting of silanol groups and alkoxysilyl groups. There is no particular limitation on the kind of the polysiloxane compound as long as the polysiloxane compound has at least two functional groups selected from the group consisting of silanol groups and alkoxysilyl groups in its molecule. It is feasible to use one kind of polysiloxane compound alone or two or more kinds of polysiloxane compounds in combination. The polysiloxane compound is obtained by hydrolysis and polycondensation of at least one kind selected from the group consisting of alkoxysilane compounds and chlorosilane compounds. In the hydrolysis and polycondensation of the at least one kind selected from the group consisting of alkoxysilane compounds and chlorosilane compounds, a cyclic siloxane compound or polydimethylsiloxane compound may be added.

For the production of a more suitable encapsulant for a semiconductor element, especially for a power semiconductor element, it is preferable that the component (A-1) contains a polysiloxane compound having at least a structural unit of the general formula [1] (hereinafter sometimes referred to as "polysiloxane compound [1]"). The component (A-1) may contain any polysiloxane compound other than the polysiloxane compound [1].

$[R^1_m SiO_{n/2}]$ [1]

In the general formula [1], $R^1$ each independently represents a hydrogen atom, a $C_1$-$C_{10}$ linear alkyl group, a $C_3$-$C_{10}$ branched alkyl group, a $C_3$-$C_{10}$ cyclic alkyl group, a $C_2$-$C_{10}$ linear alkenyl group, a $C_3$-$C_{10}$ branched alkenyl group, a $C_3$-$C_{10}$ cyclic alkenyl group or a $C_5$-$C_{10}$ aryl group; a part or all of hydrogen atoms of the alkyl group, the alkenyl group or the aryl group may be substituted by a halogen atom; a part of carbon atoms of the alkyl group, the alkenyl group or the aryl group may be replaced by at least one kind selected from the group consisting of a nitrogen atom, an oxygen atom and a silicon atom; the halogen atom is at least one kind selected from the group consisting of a fluorine atom, a chlorine atom, a bromine atom and an iodine atom; when there are a plurality of $R^1$, $R^1$ can be of the same kind or different kinds; an oxygen atom of the structural unit of the general formula [1] is a siloxane bond-forming oxygen atom or a hydroxyl oxygen atom; and m and n each independently represent an integer of 1 to 4 and satisfy a relationship of m+n=4.

Examples of the $C_1$-$C_{10}$ linear alkyl group, $C_3$-$C_{10}$ branched alkyl group or $C_3$-$C_{10}$ cyclic alkyl group as $R^1$ in the general formula [1] include methyl, ethyl, propyl, butyl, hexyl, octyl, decyl, isopropyl, isobutyl, sec-butyl, tert-butyl and cyclohexyl. Among others, methyl is preferred.

Examples of the $C_2$-$C_{10}$ linear alkenyl group, $C_3$-$C_{10}$ branched alkenyl group, or $C_3$-$C_{10}$ cyclic alkenyl group as $R^1$ in the general formula [1] include vinyl and allyl.

Examples of the $C_5$-$C_{10}$ aryl group as $R^1$ in the general formula [1] include phenyl, 1-naphthyl and 2-naphthyl. Among others, phenyl is preferred.

In order to improve the curing characteristics of the curable resin composition and effectively suppress the occurrence of cracking during encapsulation of a semiconductor element, $R^1$ is preferably a $C_1$-$C_{10}$ linear alkyl group, a $C_3$-$C_{10}$ branched alkyl group, a $C_3$-$C_{10}$ cyclic alkyl group or a $C_5$-$C_{10}$ aryl group in the structural unit of the general formula [1]. It is particularly preferable that $R^1$ is a methyl group or a phenyl group in the structural unit of the general formula [1].

The structural unit of the polysiloxane compound [1] where m is 2 and n is 2, that is, the structural unit represented by $[R^1_2 SiO_{2/2}]$ (hereinafter sometimes referred to as "bifunctional structural unit"), may include a structure of the formula [1-2] where one of oxygen atoms bonded to a silicon atom of the bifunctional structural unit constitutes a hydroxy group or an alkoxy group.

$[R^1_2 SiXO_{1/2}]$ [1]

In the formula [1-2], X represents a hydroxy group or an alkoxy group; and $R^1$ has the same meaning as in the general formula [1].

The bifunctional structural unit may contain a structural moiety surrounded by a broken line of the formula [1-b] and further contain a structural moiety surrounded by a broken line of the formula [1-2-b]. In other words, a structural unit having not only a group $R^1$ but also a hydroxy group or an alkoxy group at a terminal end thereof is included in the bifunctional structural unit. More specifically, the hydroxyl- or alkoxy-containing bifunctional structural unit contains the structural moiety surrounded by the broken line of the formula [1-2-b] in the case where an alkoxy group of the alkoxysilane compound as the raw material of the component (A-1) remains or is substituted by a hydroxy group or in the case where a chlorine atom of the chlorosilane compound as the raw material of the component (A-1) is substituted by a hydroxy group. In the formula [1-b], each oxygen atom forms a siloxane bond Si—O—Si with adjacent silicon atoms. One oxygen atom of the Si—O—Si bond is shared by the structural unit of the formula [1-b] and the adjacent structural unit and thus is expressed as "$O_{1/2}$".

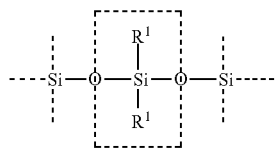
[1-b]

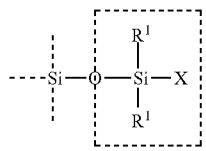
[1-2-b]

In the formula [1-2-b], X represents a hydroxy group or an alkoxy group. In the formulas [1-b] and [1-2-b], $R^1$ has the same meaning as in the general formula [1].

The structural unit of the polysiloxane compound [1] where m is 1 and n is 3, that is, the structural unit represented by $[R^1SiO_{3/2}]$ (hereinafter sometimes referred to as "trifunctional structural unit"), may include a structure of the formula [1-3] or [1-4] where one or two of oxygen atoms bonded to a silicon atom of the trifunctional structural unit constitutes a hydroxy group or an alkoxy group.

$$[R^1SiX_2O_{1/2}] \quad [1\text{-}3]$$

$$[R^1SiXO_{2/2}] \quad [1\text{-}4]$$

In the formulas [1-3] and [1-4], X represents a hydroxy group or an alkoxy group. When there are a plurality of X in the formula [1-3], X can be of the same kind or different kinds. In the formulas [1-3] and [1-4], $R^1$ has the same meaning as in the general formula [1].

The trifunctional structural unit may contain a structural moiety surrounded by a broken line of the formula [1-c] and further contain a structural moiety surrounded by a broken line of the formula [1-3-c] or [1-4-c]. In other words, a structural unit having not only a group $R^1$ but also either or both of a hydroxy group and an alkoxy group at terminal ends thereof is included in the trifunctional structural unit.

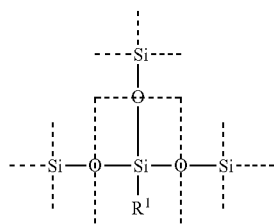
[1-c]

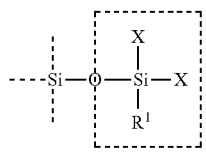
[1-3-c]

-continued

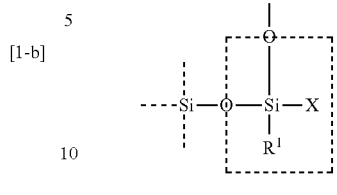
[1-4-c]

In the formula [1-2-b], X represents a hydroxy group or an alkoxy group. In the formulas [1-b] and [1-2-b], $R^1$ has the same meaning as in the general formula [1].

The polysiloxane compound [1] may have a plurality of structural units represented by the general formula [1]. In this case, the plurality of structural units can be of the same kind or different kinds.

The polysiloxane compound [1] may have, in addition to the structural unit of the general formula [1], a structural unit of the general formula [2].

$$[SiO_{4/2}] \quad [2]$$

In the general formula [2], an oxygen atom of the structural unit of the general formula [2] is a siloxane bond-forming oxygen atom or a hydroxyl oxygen atom.

The presence of the structural unit of the general formula [1] and the structural unit of the general formula [2] in the polysiloxane compound is advantageous in that the resulting cured product can easily attain improved heat resistance and good adhesion to various members. Hereinafter, the polysiloxane compound having the structural unit of the general formula [1] and the structural unit of the general formula [2] is sometimes referred to as "polysiloxane compound [2]".

In the polysiloxane compound [2], there is no particular limitation on the ratio between the structural unit of the general formula [1] and the structural unit of the general formula [2]. It is preferable that the ratio of $[SiO_{4/2}]/[R^1_mSiO_{n/2}]$ is lower than or equal to 1.0 or lower in order to facilitate controlling the mass-average molecular weight of the polysiloxane compound to within a preferable range.

(Second Embodiment)

The component (A-2) is a polysiloxane compound obtained by hydrolysis and polycondensation of at least one kind of alkoxysilane compound of the general formula [3] (hereinafter sometimes referred to as "polysiloxane compound [3]").

$$(R^1)_ySi(OR^2)_{4-y} \quad [3]$$

In the general formula [3], $R^1$ has the same meaning as in the general formula [1]; when there are a plurality of $R^1$, $R^1$ can be of the same kind or different kinds; $R^2$ each independently represents a $C_1$-$C_4$ linear alkyl group or a $C_3$-$C_4$ branched alkyl group; when there are a plurality of $R^2$, $R^2$ can be of the same kind or different kinds; and y represents an integer of 1 to 3; and Examples of the $C_1$-$C_4$ linear alkyl group or $C_3$-$C_4$ branched alkyl group as $R^2$ in the general formula [3] include methyl, ethyl, propyl, butyl, isopropyl, isobutyl and sec-butyl, tert-butyl. Among others, methyl and ethyl are preferred The alkoxysilane compound [3] is classified into a trialkoxysilane compound $(R^1Si(OR^2)_3)$, a dialkoxysilane compound $((R^1)_2Si(OR^2)_2)$ and a monoalkoxysilane compound $((R^1)_3SiOR^2)$ depending on the number of Y in the structural unit of the general formula [3]. It is feasible to use one kind of the alkoxysilane compound alone or two or more kinds of the alkoxysilane compounds in combination at an arbitrary ratio.

Examples of the trialkoxysilane compound include, but are not limited to, methyltrimethoxysilane, methyltriethoxysilane, methyltripropoxysilane, methyltriisopropoxysilane, ethyltrimethoxysilane, ethyltriethoxysilane, ethyltripropoxysilane, ethyltriisopropoxysilane, propyltrimethoxysilane, propyltriethoxysilane, propyltripropoxysilane, propyltriisopropoxysilane, isopropyltrimethoxysilane, isopropyltriethoxysilane, isopropoxyltripropoxysilane, isopropyltriisopropoxysilane, phenyltrimethoxysilane, phenyltriethoxysilane, phenyltripropoxysilane, phenyltriisopropoxysilane, trifluoromethyltrimethoxysilane, trifluoromethyltriethoxysilane, pentafluoroethyltrimethoxysilane, pentafluoroethyltriethoxysilane, 3,3,3-trifluoropropyltrimethoxysilane, 3,3,3-trifluoropropyltriethoxysilane, 3-glycidoxypropyltrimethoxysilane, 3-glycidoxypropyltriethoxysilane, [2-(3,4-epoxycyclohexyl)ethyl]trimethoxysilane, [2-(3,4-epoxycyclohexy)ethyl]triethoxysilane, 3-(methacryloyloxy)propyltrimethoxysilane, 3-(methacryloyloxy)propyltriethoxysilane, vinyltrimethoxysilane, vinyltriethoxysilane, trimethoxysilane and triethoxysilane.

Among others, methyltrimethoxysilane, methyltriethoxysilane, ethyltrimethoxysilane, ethyltriethoxysilane, phenyltrimethoxysilane, phenyltriethoxysilane, trifluoromethyltrimethoxysilane and trifluoromethyltriethoxysilane are preferred. Particularly preferred are methyltrimethoxysilane, methyltriethoxysilane, phenyltrimethoxysilane and phenyltriethoxysilane.

Examples of the dialkoxysilane compound include, but are not limited to, dimethyldimethoxysilane, dimethyldiethoxysilane, dimethyldipropoxysilane, dimethyldiisopropoxysilane, diethyldimethoxysilane, diethyldiethoxysilane, diethyldipropoxysilane, diethyldiisopropoxysilane, dipropyldimethoxysilane, dipropyldiethoxysilane, diisopropyldimethoxysilane, diisopropyldiethoxysilane, diphenyldimethoxysilane, diphenyldiethoxysilane, diphenyldipropoxysilane, diphenyldiisopropoxysilane, methylphenyldimethoxysilane, methylphenyldiethoxysilane, bis(trifluoromethyl)dimethoxysilane, bis(trifluoromethyl)diethoxysilane, bis(3,3,3-trifluoropropyl)dimethoxysilane, bis(3,3,3-trifluoropropyl)diethoxysilane, methyl(3,3,3-trifluoropropyl)dimethoxysilane and methyl(3,3,3-trifluoropropyl)diethoxysilane.

Among others, dimethyl dimethoxysilane, dimethyl diethoxysilane, diethyldimethoxysilane, diethyldiethoxysilane, diphenyldimethoxysilane, diphenyldiethoxysilane, methylphenyldimethoxysilane, methylphenyldiethoxysilane, bis(trifluoromethyl)dimethoxysilane and bis(trifluoromethyl)diethoxysilane. Particularly preferred are dimethyldimethoxysilane and dimethyldiethoxysilane.

Examples of the monoalkoxysilane compound include, but are not limited to, trimethylmethoxysilane, trimethylethoxysilane, trimethylpropoxysilane, trimethylisopropoxysilane, triethylmethoxysilane, triethylethoxysilane, triethylpropoxysilane, triethylisopropoxysilane, triphenylmethoxysilane, triphenylethoxysilane, triphenylpropoxysilane, triphenylisopropoxysilane, tris(trifluoromethyl)methoxysilane and tris(trifluoromethyl)ethoxysilane.

In the hydrolysis and polycondensation of the at least one kind of alkoxysilane compound [3], at least one kind of alkoxysilane compound of the general formula [4] (hereinafter referred to as "alkoxysilane compound [4]") may be added.

$$Si(OR^2)_4 \qquad [4]$$

In the general formula [4], $R^2$ has the same meaning as in the general formula [3]. The addition of the at least one kind of alkoxysilane compound [4] is advantageous in that the cured product can easily attain improved heat resistance and good adhesion to various members.

Examples of the alkoxysilane compound [4] are tetramethoxysilane, tetraethoxysilane, tetrapropoxysilane and tetraisopropoxysilane.

A detail explanation will be given of the process for hydrolysis and polycondensation of the at least one kind of alkoxysilane compound [3]. First, the alkoxysilane compound [3] is weighed by a predetermined amount and put into a reactor at room temperature (i.e. atmospheric temperature without heating or cooling in the range of generally about 15 to 30° C.; the same applies to the following). Then, water for hydrolysis of the alkoxysilane compound, a catalyst for polycondensation of the alkoxysilane compound and, optionally a reaction solvent, are put into the reactor. The order of introduction of the reaction materials into the reactor is not limited to the above. The reaction materials can be introduced into the reactor in any arbitrary order. In the case of using the alkoxysilane compound [4], the alkoxysilane compound [4] can be put into the reactor in the same manner as the alkoxysilane compound [3]. The resulting reaction solution is subjected to hydrolysis and polycondensation while stirring at a predetermined temperature for a predetermined time. By this, the polysiloxane compound as the component (A-2) is obtained. It is herein preferable to set the reactor as a closed system, or to equip the reactor with a reflux device such as condenser and reflux the reaction system, for the purpose of preventing unreacted alkoxysilane raw material, water, reaction solvent and/or catalyst from being distilled out of the reaction system during the hydrolysis and polycondensation.

There is no particular limitation on the amount of water used in the preparation of the component (A-2). In view of the reaction efficiency, the amount of the water used is preferably 1 to 5 times in terms of the ratio of the mole number of water to the total mole number of alkoxy group in the alkoxysilane compound as the raw material. When the mole number ratio of water is 1.0 time or higher, it is likely that hydrolysis of the alkoxysilane compound will proceed efficiently. When the mole number ratio of water is 5 times or lower, it is less likely that the alkoxysilane compound will be difficult to handle due to gelation.

In the preparation of the component (A-2), it is feasible to use the reaction solvent although the reaction can be performed in the presence of no solvent. There is no particular limitation on the kind of the reaction solvent as long as the reaction solvent does not interfere with the reaction for synthesis of the component (A-2). Among others, a water-soluble organic solvent is preferred as the reaction solvent. Particularly preferred is an alcohol solvent because the reaction proceeds at an appropriate reaction rate in the presence of the alcohol solvent. Examples of the alcohol solvent include, but are not limited to, methanol, ethanol, 1-propanol, 2-propanol, 1-butanol, 2-butanol, t-butylalcohol, propylene glycol monomethylether, propylene glycol monoethylether, propylene glycol mono-n-propylether, propylene glycol mono-n-butylether, propylene glycol mono-t-butylether, 3-methoxy-1-butanol and 3-methyl-3-methoxy-1-butanol. The amount of the reaction solvent used is preferably 1.0 time or less in terms of the mole ratio of the reaction solvent to the water used.

The condensation can be performed without the use of the reaction solvent as mentioned above. In this case, alcohol generated by hydrolysis of the alkoxysilane compound plays a role of the reaction solvent.

In the preparation of the component (A-2), the catalyst can be an acid catalyst, a base catalyst or a metal complex catalyst. An acid catalyst is preferred for ease of control of the total amount of silanol and/or alkoxysilyl group in the component (A-2). There is no particular limitation on the kind of the acid catalyst. Examples of the acid catalyst includes acetic acid, propionic acid, trifluoroacetic acid, methanesulfonic acid, trifluoromethanesulfonic acid, formic acid, oxalic acid, maleic acid, camphorsulfonic acid, benzenesulfonic acid, tosic acid, hydrochloric acid, sulfuric acid, nitric acid, phosphoric acid and boric acid. Among others, acetic acid, hydrochloric acid, sulfuric acid and nitric acid are preferred for ease of removal of the catalyst after the completion of the reaction. Particularly preferred is acetic acid. There is no particular limitation on the kind of the base catalyst. Examples of the base catalyst include 1,8-diazabicyclo[5.4.0]undec-7-ene, diethylamine, triethylamine, imidazole, pyridine, triphenylphosphine, sodium hydroxide, potassium hydroxide, lithium hydroxide, magnesium hydroxide, sodium carbonate, potassium carbonate, cesium carbonate and sodium hydrocarbonate. There is no particular limitation on the kind of the metal complex catalyst. Examples of the metal complex catalyst include zinc octoate, zinc benzoate, zinc p-tert-butylbenzoate, zinc laurate, zinc stearate, aluminum chloride, aluminum perchlorate, aluminum phosphate, aluminum triisopropoxide, aluminum acetylacetonate, aluminum butoxybisethylacetoacetate, tetrabutyl titanate, tetraisopropyl titanate, tin octoate, tin naphthenate and cobalt naphthenate.

The amount of the catalyst used in the preparation of the component (A-2) is preferably $1.0\times10^{-5}$ to $1.0\times10^{-1}$ times in terms of the ratio of the mole number of the catalyst to the total mole number of alkoxy group in the alkoxysilane compound as the raw material.

In the preparation of the component (A-2), the reaction time is varied depending on the kind of the catalyst and is generally in the range of about 3 to 48 hours. The reaction time is generally in the range of room temperature to 180° C.

After the reaction, it is preferable to separate and purify the component (A-2) from the reaction system in view of the handling of the component (A-2). There is no particular limitation on the process of separation of the component (A-2). For example, it is feasible to separate the component (A-2) from the reaction system by extraction and, more specifically, by, after the reaction, cooling the reaction solution down to room temperature and bringing the reaction solution into contact with a nonaqueous organic solvent as an extraction solvent. After the extraction, the solution may be washed with water or a sodium chloride solution and dehydrated with a drying agent as needed. The high purity component (A-2) or solution thereof is obtained by finally removing a volatile component under reduced pressure from the solution. In the case where, after the reaction, the reaction solution is separated into an aqueous layer and a product layer containing the component (A-2) at room temperature, it is feasible to remove the aqueous layer without using the extraction solvent and then purify the component (A-2) from the product layer.

Examples of the nonaqueous organic solvent used as the extraction solvent include: ether solvents such as diethyl ether, diisopropyl ether, methyl t-butyl ether and dibutyl ether; aromatic solvents such as benzene, toluene and xylene; ester solvents such as ethyl acetate and butyl acetate; chlorinated solvents such as chloroform and dichloromethane; aliphatic solvents such as pentane, hexane, heptane and cyclohexane; alcohol solvents such as 1-butanol and isobutyl alcohol; and ketone solvents such as methyl isobutyl ketone. These solvents can be used solely or as a mixture of two or more thereof at an arbitrary ratio.

There is no particular limitation on the kind of the drying agent. Examples of the drying agent include solid drying agents such as magnesium sulfate, sodium sulfate, calcium sulfate and synthetic zeolite.

There is no particular limitation on the mass-average molecular weight of the component (A). In general, it suffices that the mass-average molecular weight of the component (A) is 200 to 50000. The mass-average molecular weight of the component (A) is preferably 300 to 10000, more preferably 600 to 3000, in order to secure sufficient flowability for good mixing of the component (A) with the component (B). Herein, the mass-average molecular weight refers to a value determined by gel permeation chromatography (GPC) on the basis of a calibration curve using polystyrene as a standard material.

There is no particular limitation on the total amount of silanol and alkoxysilyl groups in the component (A). The total amount of silanol and alkoxysilyl groups in the component (A) is preferably in the range of 1 to 15 mmol/g, more preferably 3 to 15 mmol/g. When the total amount of silanol and alkoxysilyl groups in the component (A) is in the above specific range, it is possible to allow smooth curing of the curable resin composition while particularly suppressing the occurrence of foaming in the cured product. Further, it is possible to ensure good dispersibility of the component (B) in the curable resin composition and, in the case of adding an inorganic filler to the curable resin composition, good dispersibility of the inorganic filler in the curable resin composition so that the curable resin composition is able to maintain good dispersion stability for a long time when the total amount of silanol and alkoxysilyl groups in the component (A) is in the above specific range. Furthermore, the cured product of the curable resin composition is able to show good adhesion to various members when the total amount of silanol and alkoxysilyl groups in the component (A) is in the above specific range. Herein, the total amount of silanol and alkoxysilyl groups in the component (A) is determined by measuring a $^{29}$Si-NMR spectrum of the component (A) and calculating a ratio between the peak area of Si bonded to OH and OR groups and the peak area of Si not bonded to OH and OR groups.

<Synthesis or Availability of Component (A)>

There is no particular limitation on the process for synthesis or availability of the component (A). One example of the preparation of the polysiloxane compound as the component (A-1) is to perform hydrolysis and polycondensation of at least one kind selected from the group consisting of alkoxysilane compounds and chlorosilane compounds. For instance, the alkoxysilane compound may be reacted in the presence of water and catalyst for the hydrolysis and polycondensation of the alkoxysilane compound. Further, a chlorosilane compound may be hydrolyzed and used.

As one example of the polysiloxane compound as the component (A-1), it is feasible to prepare the polysiloxane compound [3] by hydrolysis and polycondensation of at least one kind of alkoxysilane compound [3]. At least one kind of alkoxysilane compound [4] may be used in combination with the alkoxysilane compound [3] during the hydrolysis and polycondensation.

The hydrolysis and polycondensation of at least one kind of alkoxysilane compound [3] and the hydrolysis and polycondensation of at least one kind of alkoxysilane compound [3] and at least one kind of alkoxysilane compound [4] can be performed according to the above-mentioned process for preparation of the polysiloxane compound as the component (A-2).

<Component (B): Silica>

The component (B) is a silica whose extract water has a pH of 6.1 or lower, preferably 4.0 to 6.1, at 25° C. In the present invention, it is possible by the addition of the component (B) to smoothly discharge gas generated during thermal curing of the curable resin composition and prevent foaming in the cured product although the condensation type polysiloxane compound is used as the component (A) in the curable resin composition.

In the present invention, the extract water of the component (B) refers to an extract obtained by stirring 10 g of the component (B) as a sample in 200 ml of purified water at 80±3° C. for 1 hour and cooling the resulting liquid to room temperature. The pH of the extract water refers to a value determined by the following method.

The pH of the extract water of the component (B) is determined according to the test method as specified in JIS K 1150: 1994. More specifically, the component (B) is dried for 2 hours in the air at about 170° C. or under vacuum at about 150° C. and then weighed by an amount of about 10 g to the second decimal place. This component (B) is put into a 300-mL beaker, followed by adding 200 ml of purified water into the beaker and covering the beaker by a watch glass. The resulting liquid is stirred at 80±3° C. for 1 hour and cooled down to room temperature. The supernatant liquid is recovered as the extract water. After the temperature of the supernatant liquid is set to 25° C., the pH of the supernatant liquid is measured with a pH meter. Herein, the pH value is read to the first decimal place. The purified water used is of $1 \times 10^{-3}$ S/m or lower electric conductivity. The pH meter used is of the model II as specified in JIS Z 8802. The beaker used is of the hard type as specified in JIS R 3505.

As the component (B), there can be used crystalline silica, natural fused silica, synthetic fused silica, deflagration silica, fumed silica, sol-gel silica, flame fused silica and precipitated silica. These silica materials can be used solely or as a mixture of two or more thereof at an arbitrary ratio. Among others, natural fused silica, synthetic fused silica and deflagration silica are preferred in view of the fact that these silica materials have good flowability at room temperature or under heating, i.e., good formability. It is feasible to use natural fused silica, synthetic fused silica or deflagration silica in combination with any other kind of silica at an arbitrary ratio. Examples of the preferable silica combination include, but are not limited to, a combination of natural fused silica and deflagration silica and a combination of synthetic fused silica and deflagration silica.

The natural fused silica is a generic term for spherical silica particles prepared by fusing natural silica rock and is manufactured as, for example, FB-series silica by Denka Company Limited., Fuselex-series silica, MSV-series silica and MSR-series silica by Tatsumori Ltd., HS-series silica by Nippon Steel & Sumikin Materials Co., Ltd. etc.

Specific examples of the FB-series silica of Denka Company Limited. include those available under the trade names of, but are not limited to, FB-5D, FB-12D, FB-20D, FB-105, FB-940, FB-9454, FB-950, FB-105FC, FB-870FC, FB-875FC, FB-9454FC, FB-950FC, FB-300FC, FB-105FD, FB-970FD, FB-975FD, FB-950FD, FB-300FD, FB-400FD, FB-7SDC, FB-5SDC, FB-3SDC, FB-405, FB-570 and FB-820.

Specific examples of the MSR-series silica of Tatsumori Ltd. include those available under the trade names of, but are not limited to, MSR-LV24 and MSR-5100.

The synthetic fused silica is a generic term for spherical silica particles prepared by e.g. fusing silicon tetrachloride and is manufactured as, for example, Exceria-series silica by Tokuyama Corporation, EMIX-series silica by Tatsumori Ltd. etc.

Specific examples of the Exceria-series silica of Tokuyama Corporation include those available under the trade names of, but are not limited to, SE-8, SE-15, SE-30, SE-40, SE-15K, SE-30K, UF-305, UF-310, UF-320, UF-345, UF-725 and ML-902SK.

Specific examples of the EMIX-series silica of Tatsumori Ltd. include those available under the trade names of, but are not limited to, EMIX-CER.

The deflagration silica is a generic term for spherical silica particles prepared by oxidation of silicon powder and is manufactured as, for example, Admafine-series silica by Admatechs., XR-series silica by Tatsumori Ltd. etc.

Specific examples of the Admafine-series silica of Admatechs. include those available under the trade names of, but are not limited to, SO-C1, SO-C2, SO-C4, SO-C5 and SO-C.

Specific examples of the XR-series silica of Tatsumori Ltd. etc. include those available under the trade names of, but are not limited to, XR-08P and XR-15P.

There is no particular limitation on the particle shape of the component (B). As the component (B), the silica can have a crushed shape, spherical shape, sheet-like shape, beads-like shape or the like. Among others, spherical silica is preferred in view of the formability of the curable resin composition. It is feasible to use, as the component (B), spherical silica in combination with any other type of silica at an arbitrary ratio.

As to the particle size distribution of the component (B), the median particle size of the silica is preferably in the range of 0.02 to 500 μm, more preferably 0.05 to 100 μm, as determined by a laser diffraction particle size distribution analysis method. The maximum particle size of the component (B) is preferably 750 μm or smaller, more preferably 150 μm or smaller. The minimum particle size of the component (B) is not particularly limited. Herein, the particle size of the component (B) is measured with a laser diffraction particle size distribution analyzer. There is no particular limitation on the type of the laser diffraction particle size distribution analyzer used. Examples of the laser diffraction particle size distribution analyzer are Microtrac manufactured by Nikkiso Co., Ltd., LA manufactured by Horiba Ltd., CILAS manufactured by CILAS Co., Ltd., Mastersizer manufactured by Malvern Instruments Ltd. and LS manufactured by Beckman Coulter Inc. In laser diffraction particle size distribution analysis, the median size, also called d50, refers to a particle size at which particles are divided into two equal parts by volume.

In general, the particle size of the natural fused silica and the particle size of the synthetic fused silica are in the range of 1 to 100 μm; and the particle size of the deflagration silica is in the range of 0.1 to 3 μm.

The smaller the particle size of the component (B), the larger the specific surface of the component (B), the larger the amount of silanol group present at the surface of the component per unit volume. There is a tendency that the effect of suppressing foaming in the cured product increases with increase in the amount of silanol group present at the surface of the component per unit volume so that it is possible to obtain the cured product without foaming even when the amount of the component (B) relative to the total amount of the components (A) and (B) is small. On the other hand, there is a tendency that the formability of the curable resin composition becomes lower as the flowability of the curable resin composition at room temperature or under heating deteriorates with decrease in the particle size of the component (B). For these reasons, it is preferable that the particle size of the component (B) is in the above specific range.

The silica contained as the component (B) may show a plurality of frequency peaks in particle size distribution analysis. In the case of forming the curable resin composition by transfer molding process, the component (B) is preferably a mixture of particles of different large sizes at a ratio convenient for closest packing (hereinafter referred to as "closest packing component (B)"). For example, it is feasible to prepare the component (B) by mixing large size particles with middle size particles, small size particles or both thereof at a given ratio such that the component (B) has a closest packing structure in which the spaces between the large size particles are filled with the middle size particles, small size particles or both thereof. By the use of the closest packing component (B), it is possible to significantly improve the flowability of the curable resin composition under heating and facilitate forming of the curable resin composition by transfer molding process. It is also possible by the use of the closest packing component (B) to increase the packing rate of the cured product and improve the mechanical strength and electrical properties of the cured product. The particle size distribution of the closest packing component (B) may show two frequency peaks in total, one in the range of 10 to 100 µm and the other in the range of 1 to 10 µm, or show three frequency peaks in total, one in the range of 10 to 100 µm, the other in the range of 1 to 10 µm and the still other in the range of 0.1 to 1 µm, as determined by a laser diffraction particle size distribution analysis method.

Specific examples of the closest packing component (B) include, but are not limited to, those manufactured under the trade names of FB-940, FB-570 and FB-820 by Denka Company Limited, Exceria ML-902SK by Tokuyama Corporation, MSR-LV24, MSR-5100 and EMIX-CER by Tatsumori Ltd. and the like. The closest packing component (B) may be prepared by mixing two or more different kinds of components (B).

Further, the component (B) may include particles having a particle size of 3 µm or smaller (hereinafter referred to as "fine particle-containing component (B)"). By the use of the fine particle-containing component (B), it is possible to promote the condensation reaction of silanol and alkoxysilyl groups in the component during heating of the curable resin composition and thereby possible to significantly increase the curing speed of the curable resin composition. The use of such a fine particle-containing component is particularly effective in the case of forming the curable resin composition by transfer molding process. In this case, it is possible to obtain various effects such as lower forming temperature, shorter forming time and improved mold releasability and improve the productivity and surface smoothness of the cured product.

The amount of the particles of 3 µm or smaller particle size in the fine particle-containing component (B) is preferably in the range of 1 to 50 mass %, more preferably 12 to 45 mass %. When the amount of the particles of 3 µm or smaller particle size in the fine particle-containing component (B) is less than 1 mass %, the above curing speed increasing effect may not be obtained. When the amount of the particles of 3 µm or smaller particle size in the fine particle-containing component (B) exceeds 50 mass %, the flowability and formability of the curable resin composition may be deteriorated.

There is no particular limitation on the kind of the particles of 3 µm or smaller particle size in the fine particle-containing component (B). As such fine silica particles, deflagration silica, fumed silica, sol-gel silica and flame fused silica are usable. Among others, deflagration silica is preferred in view of the fact that this silica material has good flowability at room temperature or under heating, i.e., good formability. Examples of the deflagration silica include those manufactured as Admafine SO-series by Admatechs., XR-series by Tatsumori Ltd. and the like.

In the case of forming the curable resin composition by transfer molding process, it is preferable that the component (B) is the closest packing component (B) and, at the same time, the fine particle-containing component (B). It is possible by the use of such a component (B) to not only improve the flowability of the curable resin composition under heating but also increase the curing speed of the curable resin composition. Examples of the closest packing/fine particle-containing component (B) include, but are not limited to, those prepared by mixing Tokuyama Corporation's silica Exceria ML-902SK and Admatechs silica Admafine SO-series such that the amount of the Admafine SO-series relative to the total amount of the Exceria ML-902SK silica and the Admafine SO-series ranges from 1 to 50 mass %.

It is preferable that silanol group remain exposed at the surface of the component (B) without chemically modifying the surface of the component (B) by a coupling agent etc. As a matter of course, chemically modified silica can be used as the component (B) unless the effects of the present invention are impaired.

In the present invention, the component (B) is used such that the amount of the component (B) relative to the total amount of the components (A) and (B) is in the range of 70 to 97 mass %. When the amount of the component (B) is less than 70 mass %, there may occur foaming in the cured product. When the amount of the component (B) exceeds 97 mass %, it becomes difficult to obtain the cured product of bulk shape. When the amount of the component (B) is in the range of 70 to 97 mass %, it is possible to obtain the cured product of bulk shape or film shape while suppressing the occurrence of foaming in the cured product.

<Other Component>

For the purpose of adjusting the physical properties of the cured product, an additive component such as inorganic filler, heat-resistant resin, mold release agent, pigment, flame retardant, curing catalyst and anti-blocking agent may be contained in addition to the components (A) and (B). These additives can be used solely or as a mixture of two or more thereof as an arbitrary ratio. There is no particular limitation on the amount of the additive component as long as the additives are used in effective amounts within the range that does not impair the foaming suppression characteristics of the cured product. The sum of the amounts of the respective additives is preferably 5 mass % or less based on the total amount of the components (A) and (B).

Examples of the inorganic filler include silica different from the silica contained as the component (B), alumina, titania, zirconia, clay mineral e.g. talc or kaolin, glass, zinc oxide, boron nitride, aluminum nitride, calcium carbonate, magnesium carbonate, zirconium phosphate, zirconium phosphate tungstate and carbon isotope e.g. diamond or carbon nanotube. These inorganic fillers can be used solely or in combination of two or more kinds thereof. There is no particular limitation on the shape of the inorganic filler. The inorganic filler can have a crushed shape, spherical shape, sheet-like shape, beads-like shape, rod-like shape, fibrous shape, acicular shape, hollow shape or the like.

Examples of the heat-resistant resin include nanocellulose, aramid fiber, carbon fiber, PEEK resin and polyimide. These heat-resistant resins can be used solely or in combination of two or more kinds thereof. There is no particular limitation on the shape of the heat-resistant resin. The heat-resistant resin can have a crushed shape, spherical shape, sheet-like shape, beads-like shape, rod-like shape, fibrous shape, acicular shape, hollow shape or the like.

Examples of the mold release agent include Candellia wax, Carnauba wax, Rice wax, Montana wax, paraffin wax, synthetic wax, tetrafluoroethylene resin, tetrafluoroethylene-perfluoroalkoxyethyelene copolymer resin, tetrafluoroethylene-hexafluoropropylene copolymer resin, tetrafluoroethylene-ethylene copolymer resin, vinylidene fluoride resin, dimethylsilicone and fluorosilicone. These mold release agents can be used solely or in combination of two or more kinds thereof.

Examples of the pigment include carbon black, hydrozincite, white lead, lithopone, titanium dioxide, precipitated barium sulfate, barite powder, red lead, red iron oxide, chrome yellow, ultramarine blue, zinc yellow, prussian blue, phthalocyanine, polycyclic pigment and azo pigment. These pigments can be used solely or in combination of two or more kinds thereof.

Examples of the flame retardant include a halogen flame retardant, a phosphorus flame retardant, a metal hydroxide flame retardant and an antimony flame retardant. These flame retardants can be used solely or in combination of two or more kinds thereof Examples of the curing catalyst include the same as those used in the preparation of the component (A). It is possible to adjust the curing speed of the curable resin composition by addition of the curing catalyst.

The anti-blocking agent may be contained in the curable resin composition in order to, when the curable resin composition is tableted, prevent adhesion or integration of the tablets and maintain the tablets at a constant shape. Examples of the anti-blocking agent include lauric acid, myristic acid, palmitic acid, margaric acid, stearic acid, arachidic acid, behenic acid, Li salt of stearic acid, Na salt of stearic acid, Mg salt of stearic acid, K salt of stearic acid, Ca salt of stearic acid, Ba salt of stearic acid, Al salt of stearic acid, Zn salt of stearic acid, Fe salt of stearic acid, Ca salt of lauric acid, Ba salt of lauric acid, Zn salt of lauric acid, Ca salt of behenic acid, Ba salt of behenic acid, Zn salt of behenic acid, Ca salt of 12-hydroxystearic acid, Mg salt of 12-hydroxystearic acid, Zn salt of 12-hydroxystearic acid, aluminum silicate, crystalline silica, natural fused silica, synthetic fused silica, deflagration silica, fumed silica, sol-gel silica, flame fused silica, precipitated silica, zeolite, clay mineral e.g. talc or kaolin, diatomite, polyethylene beads, polytetrafluoroethylene, polymethyl methacrylate, acrylic resin and silicon resin. These anti-blocking agents can be used solely or in combination of two or more kinds thereof.

For the purpose of adjusting the dispersibility of the additive component such as inorganic filler, heat-resistant resin, mold release agent, pigment, flame retardant, curing catalyst and anti-blocking agent, a coupling agent may be additionally contained in the curable resin composition. Examples of the coupling agent include methyltrimethoxysilane, methyltriethoxysilane, phenyltrimethoxysilane, phenyltriethoxysilane, ethyltrimethoxysilane, propyltrimethoxysilane, isopropyltrimethoxysilane, trifluoromethyltrimethoxysilane, pentafluoromethyltrimethoxysilane, 3,3,3-trifluoropropyltrimethoxysilane, vinyltrimethoxysilane, 2-(3,4-epoxycyclohexyl)ethyltrimethoxysilane, 3-glycidoxypropyltrimethoxysilane, 3-methacryloxypropyltrimethoxysilane, 3-aminopropyltrimethoxysilane, tris(trimethoxysilylpropyl)isocyanurate and 3-isocyanatepropyltriethoxysilane. As long as the coupling agent is contained in an effective amount within the range that does not impair the foaming suppression characteristics of the cured product, there is no particular limitation on the amount of the coupling agent. The amount of the coupling agent is preferably 2 mass % or less based on the total amount of the components (A) and (B).

<Preparation of Curable Resin Composition>

The curable resin composition of the present invention is prepared by mixing the component (A), the component (B) and, optionally, the additive component. The mixing amounts of the respective components are as mentioned above. It is preferable to uniformly disperse the respective components and, more specifically, at least disperse the component (B) without aggregation in the component (A). By ensuring good dispersibility of the component (B) in the component (A), it is possible for the cured product of the curable resin composition to attain good adhesion and mechanical strength.

There is no particular limitation on the process for uniform dispersion of the respective components. In general, the respective components are uniformly dispersed by kneading the respective components together at room temperature or under heating. There is also no particular limitation on the order of introduction of the respective components. It is feasible to introduce all the components into a kneading container and then knead the components in the kneading container. It is alternatively feasible to introduce the respective components in any arbitrary order into the kneading container and gradually knead the components in the kneading container. In the case of using two or more different kinds of components (A) and/or two or more different kinds of components (B), these component ingredients may be mixed together and then introduced into the kneading container or may be separately introduced into the kneading container. As means of kneading two or more kinds of components (A), there can be used a mixing machine such as magnetic stirrer, mechanical stirrer, mixer, planetary mixer, agitation defoaming device, static mixer, double-arm kneader or pressure kneader. As means of kneading two or more kinds of components (B), there can be used a mixing machine such as mechanical stirrer, mixer, planetary mixer, Spartan mixer, agitation defoaming device, high-speed fluidizing mixing device, container rotary mixing device, V-type mixing device, W-type mixing device, double-arm kneader or pressure kneader.

One example of the preparation of the curable resin composition is to, in the case of using two or more kinds of components (B), previously mix two or more kinds of components (B) and knead at least the components (A) and (B). By the use of the previously-mixed component (B), it is possible to efficiently obtain the cured product with good formability. The reason for this is assumed that, although there may occur aggregation between the particles of the component (B) depending on the kinds, shapes and sizes of the particles of the component (B), the occurrence of such particle aggregation is suppressed by previously mixing the particles of the component (B).

Another example of the preparation of the curable resin composition is to, in the case of using two or more kinds of components (B), knead one or more kinds of components (B) with the component (A) and then knead another one or more kinds of component (B) with the resulting kneaded composition.

Still another example of the preparation of the curable resin composition is to, in the case of using three or more kinds of components (B), previously mix two or more kinds of components (B), knead the previously-mixed component (B) with the component (B) and then knead another one or more kinds of components (B) with the resulting kneaded composition.

There is no particular limitation on the process of kneading of the respective components for the preparation of the curable resin composition. It is feasible to knead the respective components by manual means using a spatula, mortar or the like or by means of a kneading machine. As the kneading machine, there can be used a grinding device, two roll mill, three roll mill, Kneadex, high-speed fluidizing mixing device, planetary mixer, double-arm kneader, pressure kneader, continuous kneader or the like. In order to prepare the curable resin composition with very good dispersibility of the respective components, it is preferable to knead the respective components by means of a double-arm kneader, pressure kneader or continuous kneader.

In the case of kneading the respective components by the kneading machine for the preparation of the curable resin composition, the kneading temperature is preferably in the range of room temperature to 250° C. The kneading time is not particularly limited. The respective components may be kneaded under reduced pressure or with the flow of inert gas.

It is feasible to prepare the curable resin composition by, in advance of kneading the respective components, subjecting the respective components to so-called prekneading as pretreatment for uniformizing the components to a certain degree by a mixing machine. As the mixing machine for prekneading, there can be used a mechanical stirrer, mixer, planetary mixer, high-speed fluidizing mixing device, agitation defoaming device, grinding device or the like. The whole or part of the components can be subjected to prekneading. As a matter of course, the curable resin composition may be prepared by kneading without prekneading.

The curable resin composition may be subjected to heat treatment for partial condensation of the component (A) (hereinafter referred to as "B-staging") in the resin composition. By the B-staging, it is possible to adjust the flowability of the curable resin composition at room temperature or under heating in accordance with the forming process while increasing the curing speed of the curable resin composition. It is particularly preferable to perform the B-staging in the case of forming the resin composition by transfer molding process. The curable resin composition can be B-staged by, after kneading the respective components, leaving the resulting kneaded composition still in an oven of given temperature. Alternatively, the curable resin composition can be B-staged while kneading the respective components. It is alternatively feasible to obtain the B-staged curable resin composition by subjecting the component (A) to heat treatment and then kneading the component (A) with the other component.

In the B-staging of the curable resin composition, the heating time is preferably in the range of 50 to 250° C. There is no particular limitation on the heating time in the B-staging of the curable resin composition. The B-staging may be performed under reduced pressure or with the flow of inert gas.

[Tableting of Curable Resin Composition]

The curable resin composition of the present invention may be tableted for use in various forming processes. There is no particular limitation on the process of forming of the curable resin composition. The curable resin composition can be formed by cast molding process, dip forming process, drop forming process, compression molding process, transfer molding process, injection molding process or the like. In the case of forming the curable resin composition by compression molding process, transfer molding process or injection molding process, the curable resin composition, when in paste or clay-like form, may be adhered, integrated or deformed, without being maintained at a constant shape, and thereby become difficult to measure, transfer and feed into a molding machine. The curable resin composition, when in tablet form, is easy to measure, transfer and feed into a molding machine so that it is possible to automatize measurement, transfer and feeding of the curable resin composition for significant improvement of productivity. In particular, the curable resin composition is preferably in tablet form in the case of forming the curable resin composition by transfer molding process. The term "tablet" as used herein means a solid capable of maintaining a constant shape at room temperature with substantially no secular change in shape.

There is no particular limitation on the shape of the tableted product of the curable resin composition. The tableted product can have a cylindrical column shape, rectangular column shape, circular disc shape, spherical shape, ring shape or the like.

There is no particular limitation on the process for tableting of the resin composition. It is feasible to process the resin composition into tablets by means of a mold and a press machine, by means of a tableting machine with a mortar and pestle jigs, or by extruding the resin composition into a strand through an extruding machine and cutting the strand at equal intervals. As the tableting machine, there can be used a hydraulic tableting machine, serve motor-type tableting machine, rotary tableting machine or the like. As the extruding machine, there can be used a plunger extruder, uniaxial extruder, biaxial extruder, biaxial uniaxial extruder or the like.

In the case of tableting the curable resin composition by means of the mold and the press machine or by means of the tableting machine, it is preferable to pulverize the curable resin composition to a particle size of 10 mm or smaller or to preform the curable resin composition into a rectangular column shape, cylindrical column shape, crushed shape, spherical shape, acicular shape etc. of 15 mm or smaller on one side. The curable resin composition can be pulverized to a particle size of 10 mm or smaller by manual means using a mortar or the like or by means of a pulverizer such as hammer mill, cutter mill or freezing pulverizer. The curable resin composition can be preformed into a rectangular column shape, cylindrical column shape, crushed shape, spherical shape, acicular shape etc. of 15 mm or smaller on one side by means of an extruding machine such as plunger extruder, uniaxial extruder, biaxial extruder, biaxial uniaxial extruder or the like.

There is no particular limitation on the process of containing the anti-blocking agent in the tableted product of the curable resin composition. It is feasible to add the anti-blocking agent simultaneously with the mixing of the components (A) and (B) and the other additive or to add the anti-blocking agent during or immediately after the pulverization or preforming of the curable resin composition. By the addition of the anti-blocking agent, it is possible to improve the flowability of the pulverized or preformed product of the curable resin composition and improve the workability of the resin composition during the tableting by the mold and the press machine or by the tableting machine.

[Cured Product]

According to the present invention, there is provided a cured product of the above curable resin composition. Even though the condensation polymerizable polysiloxane compound is used as the component (A) in the curable resin composition, it is possible to obtain the cured product in various shapes and sizes without causing foaming during curing. The cured product of the present invention is able to show very high heat resistance as the crosslinking structure of the cured product is constituted only by chemically stable siloxane bond. There occur substantially no deteriorations in the weight and mechanical strength of the cured product of the present invention even when exposed to high-temperature conditions of about 250° C. for a predetermined time. Further, the cured product of the present invention is able to show good adhesion to various members as either or both of silanol and alkoxysilyl groups remain in parts of the cured product.

The cured product of the present invention is suitably usable as an encapsulant for a semiconductor element. Since there occurs no foaming in the cured product even when formed in various sizes, the cured product is particularly suitably applicable as an encapsulant for a semiconductor where large encapsulant thickness and area are required. The encapsulant thickness is preferably 1 mm or greater, more preferably 2 mm or greater, still more preferably 4 mm or greater. As a matter of course, the cured product is applicable as an encapsulant for a semiconductor where an encapsulant thickness smaller than the above value is required. The upper limit of the encapsulant is not particularly limited. For example, the encapsulant thickness can be set to 100 mm or smaller, especially 20 mm or smaller. The cured product is suitable for use as an encapsulant for a power semiconductor element because of its very high heat resistance.

The cured product of the present invention is obtained by curing the above curable resin composition.

There is no particular limitation on the curing temperature as long as the curing reaction of the curable resin composition proceeds. It is feasible to cure the resin composition by heating at a constant temperature or by changing the curing temperature in multiple stages or continuously as needed. The lower limit of the curing temperature is not particularly limited but is preferably 150° C. or higher. The upper limit of the curing temperature is not particularly limited but is preferably 250° C. or lower. The curing time can be set to various times. The curing pressure can be set to various pressures as needed. It is feasible to cure the resin composition by heating at ordinary pressure, under pressurized conditions or under reduced conditions.

The cured product may be obtained by subjecting the curable resin composition to forming. There is no particular limitation on the process of forming of the curable resin composition. It is feasible to form the curable resin composition by cast molding process, dip forming process, drop forming process, compression molding process, transfer molding process, injection molding process or the like. Among others, cast molding process, compression molding process and transfer molding process are preferred for ease of forming.

The cured product may be obtained by tableting the curable resin composition and subjecting the tableted product of the curable resin composition to forming.

In one embodiment of the present invention, the cured product is obtained by feeding the curable resin composition to a forming die, forming the curable resin composition in the forming die, and then, heating and curing the curable resin composition in the present invention. As in the case of the above-mentioned curing temperature and pressure, the temperature and pressure during the feeding and forming can be set to various temperatures. The heating may be performed simultaneously with the forming. In this case, it is feasible to obtain the cured product by taking the formed product out of the forming die in a state where the curing reaction of the resin composition has proceeded halfway, and then, completely curing the product through additional heat treatment (hereinafter sometimes referred to as "post curing").

One example of the production of the cured product by cast molding process is to feed the curable resin composition into a mold of given shape and material in a temperature range of room temperature to below 150° C., and then, cure the curable resin composition in the casing mold by heating. There is no particular limitation on the means of feeding the curable resin composition. The curable resin composition can be dipped up and fed by means of a tool such as spatula or can be fed by means of a feeding machine such as dispenser.

One example of the production of the cured product by compression molding process is to arrange the curable resin composition between compressing mold members of given shape and material at room temperature, and then, compress the curable resin composition between the mold members while heating by a thermal press machine. The compression molding temperature is preferably in the range of 150 to 250° C. The compression molding pressure is preferably 10 MPa or higher. The holding time is preferably in the range of 1 to 30 minutes. The cured product may be obtained by, after taking the compression molded product out from the molds, subjecting the compression molded product to post curing as needed.

One example of the production of the cured product by transfer molding process is to preform the curable resin composition in tablets, feed the preformed curable resin composition to a preheated transfer molding machine, and then, pressurize and transfer the curable resin composition into a mold of given shape and material by a plunger of the transfer molding material. The transfer molding temperature is preferably in the range of 150 to 250° C. The transfer molding pressure is preferably in the range of 1 to 50 MPa. The holding time is preferably in the range of 30 seconds to 20 minutes. The transfer molding may be performed while depressurizing the inside of the mold. The cured product may be obtained by, after taking the transfer molded product out from the mold, subjecting the transfer molded product to post curing as needed.

In the case of forming the curable resin composition by compression molding process, transfer molding process or injection molding process, a mold release agent may be applied to the mold in advance. The mold release agent can be of the organic type, fluorinated type, silicone type etc. Further, the mold release agent can be in liquid form, spray form, bulk form, tablet form etc. In the case where the mold release agent is in tablet form, it is feasible to apply the mold release agent to the mold by forming the mold release agent before forming the curable resin composition. As a matter of course, the molding can be performed without the application of the mold release agent to the mold.

In the case of transfer molding the curable resin composition, the gelation time of the curable resin composition is preferably in the range of 1 to 120 seconds at 150 to 250° C., especially 1 to 40 seconds at 180° C. The gelation time refers to a time from the melting to the loss of the flowability or adhesion during heating of the curable resin composition at a constant temperature. The gelation time of the curable resin composition can be measured with the use of a hot plate, a spatula and a stopwatch. Alternatively, the gelation time of the curable resin composition can be measured with a torque meter as a time lapsed until the thickening during heating of the curable resin composition at a constant temperature. There is no particular limitation on the type of the torque meter used. Examples of the torque meter are Curelastometer manufactured by JSR Trading Co., Ltd., MDRH 2030 manufactured by M&K Co., Ltd., MDRH Next I manufactured by Techpro Japan Inc. and VR-3110 manufactured by Ueshima Seisakusho Co., Ltd. The other measurement conditions are set so as to comply with EIMS T901: 2006.

In the case of transfer molding the curable resin composition, the spiral flow (length) of the curable resin composition is preferably in the range of 5 to 180 cm at a molding temperature of 150 to 250° C. It is particularly preferable that the spiral flow of the curable resin composition is 5 to 180 cm, more preferably 10 to 130 cm, at 180° C. The cured product as obtained by transfer molding of the curable resin composition is able to attain good surface smoothness and mold shape reproducibility without chipping when the spiral flow of the curable resin composition is in the above specific range. The spiral flow refers to a numerical value indicating ease of flow of the curable resin composition during molding and is defined as, when the curable resin composition is subjected to transfer molding in a test mold with a spiral flow channel, a length of the curable resin composition at the time the flow of the curable resin composition stops. The molding time is set to 3 minutes. The molding pressure is set to 6.9 MPa. The mold specifications and the other measurement conditions are set so as to comply with Japan Electrical Insulating and Advanced Performance Materials Industrial Association Standard T901 (2006) (abbreviated as EIMS T901: 2006).

In the case of transfer molding the curable resin composition, the melt viscosity of the curable resin composition is preferably in the range of 1 to 500 Pa·sec at 120 to 250° C. Herein, the melt viscosity of the curable resin composition is measured by a constant temperature measurement method with the use of a flow tester. There is no particular limitation on the type of the flow tester used. Examples of the flow tester are CFT manufactured by Shimadzu Corporation and 1548-C manufactured by Imoto Machinery Co., Ltd. The other measurement conditions are set so as to comply with EIMS T901: 2006.

The above gelation time, spiral flow length and melt viscosity can be adjusted according to the conditions of the B-staging. The gelation time and spiral flow length decrease with increase in the temperature and/or time of the B-staging. The melt viscosity increases with increase in the temperature and/or time of the B-staging.

There is no particular limitation on the process of post curing of the cured product. It is preferable to perform the post curing by leaving the cured product still in an oven of 150 to 250° C. The time of the heat treatment of the cured product is preferably 1 hour or longer at 250° C., 2.5 hours or longer at 200° C. and 3.5 hours or longer at 175° C.

In the case of obtaining the cured product by transfer molding process, the curing speed of the curable resin composition can be evaluated by the surface smoothness of the cured product. It is for the reasons that: the surface smoothness of the cured product not only shows the quality of the cured product but also is correlated with the mold releasability of the curable resin composition; and, as is generally known, the mold releasability of the curable resin composition tends to be correlated with the curing speed of the curable resin composition. The slower the curing speed of the curable resin composition, the softer the molded product after the transfer molding so that, at the time of release of the mold, a part of the cured product becomes adhered to the mold to thereby cause deterioration in the surface roughness of the cured product.

[Semiconductor Device]

In the present invention, there is provided a semiconductor device having at least a semiconductor element encapsulated by the cured product of the curable resin composition. The other configuration of the semiconductor device is no particularly limited. The semiconductor device may be provided with any other structural component. Examples of the other semiconductor device component include a base substrate, a lead line, a wiring line, a control element, an insulating substrate, a heat sink, a conductor, a die bond material and a bonding pad. Not only the semiconductor element but also some or all of the semiconductor device components may be encapsulated by the cured product of the curable resin composition.

Herein, there are standards for categorization of power semiconductor packages by JEDEC (Joint Electron Device Engineering Counsil), JEITA (Japan Electronics and Information Technology Industries Association) etc. These standards define package configurations such as TO-3, TO-92, TO-220, TO-247, TO-252, TO-262, TO-263 and D2. In the present invention, the semiconductor device can be provided in any of the above package configurations. The semiconductor device may be provided as defined by any other standards.

One example of the semiconductor device is shown in FIG. 1. As shown in FIG. 10, the semiconductor device 10 has at least a power semiconductor element 1, an encapsulant 2, a lead line 3, a wiring line 4, a base substrate, 5 and an insulating substrate 6. The power semiconductor element 1 is bonded to the base substrate vie a die bond material (not shown). The base substrate 5 is arranged on the insulating substrate 6. A bonding pad of the poser semiconductor element 1 is electrically connected to the lead line 3 by the wiring line 4. The power semiconductor element 1, the lead line 3, the wiring line 4, the base substrate 5 and the insulating substrate 6 are encapsulated by the encapsulant 2.

The structure of FIG. 1 is merely one example of the semiconductor device of the present invention. It is feasible to modify the frame structure of the semiconductor device, the mounting structure of the semiconductor element etc. as appropriate and to add the other semiconductor device component as appropriate.

[Manufacturing of Semiconductor Device]

In the present invention, the semiconductor device is manufactured by cast molding, compression molding or transfer molding the curable resin composition and encapsulating the semiconductor element by the cured molded product of the curable resin composition.

EXAMPLES

The present invention will be described in more detail below by way of the following examples. It should be noted that the following examples are not intended to limit the present invention thereto.

<Polysiloxane Compound>

Polysiloxane compounds were synthesized in the following synthesis examples and tested for their respective physical properties by the following methods.

[Identification of Total Amount of Silanol and Alkoxysilyl Groups]

The total amount of silanol and alkoxysilyl Groups in each synthesized polysiloxane compound was identified by $^{29}$Si-NMR analysis with the use of a 400-MHz nuclear magnetic resonance spectrometer (manufactured by JEOL Ltd., model: JNM-AL400).

[Determination of Mass-Average Molecular Weight]

The mass-average molecular weight (Mw) of each synthesized polysiloxane compound was determined under the following conditions by gel permeation chromatography (GPC) on the basis of a calibration curve using polystyrene as a standard material.

Chromatograph: manufactured by Tosoh Corporation, model: HLC-8320GPC
Column: manufactured by Tosoh Corporation, trade name: TSK gel Super HZ 2000×4, 3000×2
Eluent: tetrahydrofuran

[Quantification of Structural Unit Composition]

The composition ratio of a structural unit derived from an alkoxysilane compound as a raw material in each synthesized polysiloxane compound was quantified by $^1$H-NMR and $^{29}$Si-NMR analysis with the use of a 400-MHz nuclear magnetic resonance spectrometer (manufactured by JEOL Ltd., model: JNM-AL400).

Synthesis Example 1

Synthesis of Polysiloxane Compound (A-a)

Into a 2-L four-neck flask with an agitation blade of fluororesin and a Dimroth condenser, 240.40 g (1.000 mol) of phenyltriethoxysilane and 148.30 g (1.000 mol) of dimethyldiethoxysilane were placed. Subsequently, 239.64 g of isopropyl alcohol, 185.02 g of water and 0.12 g of acetic acid were placed into the flask. The resulting mixture was subjected to hydrolysis and condensation by stirring while heating the flask at 100° C. After a lapse of 18 hours, the thus-obtained reaction solution was returned to room temperature. The reaction solution was then separated into two layers by adding 400 ml of diisopropyl ether and 400 ml of water to the reaction solution and stirring the reaction solution. The separated upper layer of the reaction solution was recovered and washed twice with 400 ml of water. A slight amount of water dissolved in the diisopropyl ether was removed by anhydrous magnesium sulfate. After the anhydrous magnesium sulfate was filtered out, the diisopropyl ether was distilled out under reduced pressure by an evaporator. By this, the target polysiloxane compound (A-a) was obtained as a colorless viscous liquid. The yield of the polysiloxane compound was 182.57 g. The mass-average molecular weight (Mw) of the polysiloxane compound was 828. The composition of the polysiloxane compound was $[PhSiO_{3/2}]_{1.00}[Me_2SiO_{2/2}]_{0.82}$. The total amount of silanol and alkoxysilyl groups in the polysiloxane compound was 5.76 mmol/g.

Synthesis Example 2

Synthesis of Polysiloxane Compound (A-b)

Into a 1-L four-neck flask with an agitation blade of fluororesin and a Dimroth condenser, 198.30 g (1.000 mol) of phenyltrimethoxysilane was placed. Subsequently, 144.00 g of isopropyl alcohol, 108.00 g of water and 0.072 g of acetic acid were placed into the flask. The resulting mixture was subjected to hydrolysis and condensation by stirring while heating the flask at 100° C. After a lapse of 6 hours, the thus-obtained reaction solution was returned to room temperature. The reaction solution was then separated into two layers by adding 200 ml of diisopropyl ether and 200 ml of saturated sodium chloride solution to the reaction solution and stirring the reaction solution. The separated upper layer of the reaction solution was recovered and washed twice with 200 ml of water. A slight amount of water dissolved in the diisopropyl ether was removed by anhydrous magnesium sulfate. After the anhydrous magnesium sulfate was filtered out, the diisopropyl ether was distilled out under reduced pressure by an evaporator. By this, the target polysiloxane compound (A-b) was obtained as a colorless solid. The yield of the polysiloxane compound was 135.10 g. The mass-average molecular weight (Mw) of the polysiloxane compound was 943. The total amount of silanol and alkoxysilyl groups in the polysiloxane compound was 7.13 mmol/g.

Synthesis Example 3

Synthesis of Polysiloxane Compound (A-c)

Into a 1-L four-neck flask with an agitation blade of fluororesin and a Dimroth condenser, 136.20 g (1.000 mol) of methyltrimethoxysilane was placed. Subsequently, 144.00 g of isopropyl alcohol, 108.00 g of water and 0.072 g of acetic acid were placed into the flask. The resulting mixture was subjected to hydrolysis and condensation by stirring while heating the flask at 100° C. After a lapse of 6 hours, the thus-obtained reaction solution was returned to room temperature. The reaction solution was then separated into two layers by adding 200 ml of diisopropyl ether and 200 ml of water to the reaction solution and stirring the reaction solution. The separated upper layer of the reaction solution was recovered and washed twice with 200 ml of water. The diisopropyl ether was distilled out under reduced pressure by an evaporator. By this, the target polysiloxane compound (A-c) was obtained as a colorless viscous liquid. The yield of the polysiloxane compound was 19.66 g. The mass-average molecular weight Mw of the polysiloxane compound was 932. The total amount of silanol and alkoxysilyl groups in the polysiloxane compound was 12.5 mmol/g.

Synthesis Example 4

Synthesis of Polysiloxane Compound (A-d)

Into a 2-L three-neck flask with an agitation blade of fluororesin and a Dimroth condenser, 96.2 g (0.80 mol) of dimethyldimethoxysilane, 158.6 g (0.80 mol) of phenyltrimethoxysilane and 52.1 g (0.25 mol) of tetraethoxysilane were placed. Subsequently, 239.6 g of isopropyl alcohol, 185.0 g of water and 0.12 g of acetic acid were placed into the flask. The resulting mixture was subjected to hydrolysis and condensation by stirring while heating the flask at 100° C. After a lapse of 6 hours, the thus-obtained reaction solution was returned to room temperature. The reaction solution was then separated into two layers by adding 400 ml of diisopropyl ether and 400 ml of water to the reaction solution and stirring the reaction solution. The separated upper layer of the reaction solution was recovered and washed twice with 400 ml of water. The diisopropyl ether was distilled out under reduced pressure by an evaporator. By this, the target polysiloxane compound (A-d) was obtained as a colorless viscous liquid. The yield of the polysiloxane compound was 143.4 g. The mass-average molecular weight Mw of the polysiloxane compound was 1100. The total amount of silanol and alkoxysilyl groups in the polysiloxane compound was 7.7 mmol/g.

Synthesis Example 5

Synthesis of Polysiloxane Compound (A-e)

Into a 2-L three-neck flask with an agitation blade of fluororesin and a Dimroth condenser, 60.11 g (0.50 mol) of dimethyldimethoxysilane and 68.11 g (0.50 mol) of methyltrimethoxysilane were placed. Subsequently, 120.0 g of isopropyl alcohol, 90.0 g of water and 0.060 g of acetic acid were placed into the flask. The resulting mixture was subjected to hydrolysis and condensation by stirring while heating the flask at 100° C. After a lapse of 6 hours, the thus-obtained reaction solution was returned to room temperature. The reaction solution was then separated into two layers by adding 200 ml of diisopropyl ether and 200 ml of water to the reaction solution and stirring the reaction solution. The separated upper layer of the reaction solution was recovered and washed twice with 200 ml of water. The diisopropyl ether was distilled out under reduced pressure by an evaporator. By this, the target polysiloxane compound (A-e) was obtained as a colorless viscous liquid. The yield of the polysiloxane compound was 55.0 g. The mass-average molecular weight Mw of the polysiloxane compound was 618. The total amount of silanol and alkoxysilyl groups in the polysiloxane compound was 10.1 mmol/g.

Synthesis Example 6

Synthesis of Polysiloxane Compound (A-f)

Into a 2-L three-neck flask with an agitation blade of fluororesin and a Dimroth condenser, 30.1 g (0.25 mol) of dimethyldimethoxysilane and 102.17 g (0.75 mol) of methyltrimethoxysilane were placed. Subsequently, 132.0 g of isopropyl alcohol, 99.0 g of water and 0.066 g of acetic acid were placed into the flask. The resulting mixture was subjected to hydrolysis and condensation by stirring while heating the flask at 100° C. After a lapse of 24 hours, the thus-obtained reaction solution was returned to room temperature. The reaction solution was then separated into two layers by adding 200 ml of diisopropyl ether and 200 ml of water to the reaction solution and stirring the reaction solution. The separated upper layer of the reaction solution was recovered and washed twice with 200 ml of water. The diisopropyl ether was distilled out under reduced pressure by an evaporator. By this, the target polysiloxane compound (A-f) was obtained as a colorless viscous liquid. The yield of the polysiloxane compound was 64.8 g. The mass-average molecular weight Mw of the polysiloxane compound was 945. The total amount of silanol and alkoxysilyl groups in the polysiloxane compound was 8.8 mmol/g.

<Silica>

The physical properties of silica were tested by the following method.

[pH Measurement of Silica Extract Water]

The pH of each silica extract water was determined according to JIS K 1150: 1994. More specifically, the silica was dried in the air at 170° C. for 2 hours, weighed by an amount of 10.00 g and put into the after-mentioned 300-ml beaker. Into the beaker, 200 ml of the after-mentioned purified water was added. The beaker was then covered by a watch glass. The resulting liquid was stirred at 80° C. for 1 hour and cooled down to room temperature. The supernatant liquid was recovered as the silica extract. After the temperature of the supernatant liquid was set to 25° C., the pH value of the supernatant liquid was measured with the after-mentioned pH meter. Herein, the pH value was read to one decimal place.

Beaker: hard type, as specified in JIS R 3505
Purified Water: $1 \times 10^{-3}$ S/m or lower electric conductivity
pH meter: model D-54 and 9681-10D manufactured by Horiba Ltd., as specified in JIS Z 8802

<Curable Resin Composition>

In Examples of 1 to 28, Comparative Examples 1 to 5 and Reference Example 1, curable resin compositions were prepared by the following procedures using the respective components in amounts as shown in TABLE 1.

[Kneading of Components]

In the case of kneading the respective components such as polysiloxane compound and silica with the use of a mortar, the respective components were kneaded together in the mortar at room temperature until the properties of the resulting composition were judged to be uniform by hand touch. The total amount of the respective components was adjusted to 60 g or less.

In the case of kneading the respective components such as polysiloxane compound and silica with the use of a continuous kneader, the respective components were subjected to prekneading by a planetary mixer, and then, kneaded together by the continuous kneader (S1KRC kneader manufactured by Kurimoto Ltd.). The total amount of the respective components was adjusted to 300 to 1000 g. The prekneading was performed in the planetary mixer at room temperature until the properties of the resulting composition were judged to be uniform by visual inspection and hand touch. Although the prekneading time was varied depending on the amount and kind of the curable resin composition, the kneading time was set to be 20 to 150 minutes. The kneading was performed at 40° C. by feeding and passing the prekneaded composition one time through the continuous kneader. The feeding speed of the prekneaded composition was set to 20 g/min. The rotation speed of the continuous kneader was set to 300 $min^{-1}$. In the case of using two kinds of silica, these two kinds of silica were mixed together by a planetary mixer before the prekneading. The mixing time was set to 180 minutes.

[B-staging of Curable Resin Composition]

Only in the case of forming the curable resin composition by transfer molding process, the curable resin composition was subjected to B-staging by spreading the kneaded composition in a tray of fluororesin, leaving the tray still in an oven and thereby heating the kneaded composition. Although the B-staging temperature and time were varied depending on the kind of the curable resin composition, the B-staging temperature was set to be 100 to 120° C.; and the B-staging time was set to be 2.5 to 39 hours. By this B-staging treatment, the after-mentioned gelation time of the curable resin composition was adjusted to 1 to 40 seconds; and the after-mentioned spiral flow length of the curable resin composition was adjusted to an arbitrary value.

[Gelation Time Measurement of B-Staged Curable Resin Composition]

The gelation time of each B-staged curable resin composition was determined by the following method.

A metal plate was heated to 180° C. by a hot plate. Upon placing 0.5 to 2.0 g of the curable resin composition on the metal plate, a stopwatch was started for time measurement. During the time measurement, the curable resin composition was stirred by a metal spatula. The stopwatch was stopped at the time the curable resin composition lost its adhesion and became peeled off from the metal plate. The measured time was read as the gelation time.

[Tableting of Curable Resin Composition]

The curable resin composition was tableted by putting 40 g of the curable resin composition into a cylindrical mold of 38 mm diameter and press the curable resin composition with a press machine at room temperature for 10 seconds. The forming pressure was set to 3 MPa.

<Evaluation of Tableted Curable Resin Composition>

The tablets of the curable resin composition, as obtained above in Examples 1 and 22, were tested for the tablet-to-tablet adhesion resistance and shape maintenance by the following methods.

[Evaluation Test for Adhesion Resistance of Tableted Curable Resin Composition]

One of the cylindrical tablets was placed in a horizontal position with a flat surface thereof oriented downward. On this tablet, another one of the cylindrical tablets was overlaid with a flat surface thereof oriented downward. After the two tablets were left still at room temperature for 24 hours, the upper-side tablet was lifted up to evaluate the adhesion resistance between the two tablets. In TABLE 3, the symbol "○" means that the adhesion resistance between the tablets was good; and the symbol "⊙" means that the adhesion resistance between the tablets was very good.

[Evaluation Test for Shape Maintenance of Tableted Curable Resin Composition]

The cylindrical tablet was placed in a horizontal position with a flat surface thereof oriented downward. After the tablet was left still at room temperature for 24 hours, the shape of the tablet was visually checked. In TABLE 3, the symbol "○" means that the tablet had good shape maintenance; and the symbol "⊙" means that the tablet had very good shape maintenance.

<Forming of Curable Resin Composition and Production of Cured Product>

In Examples of 1 to 28, Comparative Examples 1 to 5 and Reference Example 1, cured products were obtained by subjecting the respective curable resin compositions to any of the following forming processes.

[Cast Molding Process]

The curable resin composition was fed to a glass or silicon rubber mold of 21 mm diameter at room temperature, poured in the mold to a height of 15 mm and thereby subjected to molding. The cured product was obtained by heat treating the resulting cast molded product in the mold at 250° C. for 1 hour.

[Compression Molding Process]

The curable resin composition was fed into a mold (40 mm×60 mm or 100 mm×100 mm cavity size) at room temperature, pressed in the mold while heating at 250° C. by a thermal press machine (26-ton hydraulic molding machine manufactured by Toho Seisakusho Co., Ltd.) and thereby subjected to molding. The molding pressure was set to 50 MPa when the mold was of 40 mm×60 mm cavity size. When the mold was of 100 mm×100 mm cavity size, the molding pressure was set to 25 MPa. The cured product was obtained by releasing the resulting compression molded product from the mold and subjecting the compression molded product to post curing heat treatment at 250° C. for 1 hour.

[Transfer Molding Process]

The tableted product of the curable resin composition was put in a transfer molding machine (MF-0 manufactured by Marushichi Engineering Co., Ltd.), which had been heated to 180° C. or 200° C., pressed into a six cavity mold of 10 mm×70 mm cavity size and 3 mm thickness, a single cavity mold of 70 mm×70 mm cavity size and 3 mm thickness, a double cavity mold of 13 mm×120 mm cavity size and 3 mm thickness, a double cavity mold of 13 mm×125 mm cavity size and 1.6 mm thickness or a single cavity mold of 90 mm diameter and 3 mm thickness at 6.9 MPa and 180° C. or 200° C. for 15 minutes and thereby subjected to molding. The mold was used with the application of a mold release agent (trade name: Daifree, manufactured by Daikin Industries, Ltd.). The cured product was obtained by releasing the resulting transfer molded product from the mold and subjecting the transfer molded product to post curing heat treatment at 250° C. for 1 hour.

[Spin Coating Process]

A film of the curable resin composition, which consisted only of the polysiloxane compound, was formed by dropping the curable resin composition onto a silicon substrate of 100 mm diameter and rotating the silicon substrate with a spin coater at 500 rpm for 10 seconds. The cured product was obtained by heat treating the film of the curable resin composition on the substrate at 250° C. for 1 hour.

<Evaluation of Cured Product>

The cured products of Examples 1-28, Comparative Examples 1-4 and Reference Example 1 were tested for the occurrence of foaming by the following method.

[Evaluation Test for Foaming Occurrence of Cured Product]

The cured product was checked by visual inspection. In TABLE 1, the wording "not occur" means that no foaming was seen in the cured product; and the wording "occur" means that foaming was seen in the cured product.

The cured products of Examples 8-16 and 23-24 were tested for the surface smoothness by the following method.

[Evaluation Test for Surface Smoothness of Cured Product]

The surface of the cured product was checked by finger touch. In TABLES 2 and 4, the symbol "○" means that the cured product had good surface smoothness; and the symbol "⊙" means that the cured product had very good surface smoothness.

The cured products of Examples 11, 13-16 and 23-24 were tested for the non-occurrence of chipping by the following method.

[Evaluation Test for Chipping Non-Occurrence of Cured Product]

The cured product was checked by visual inspection. In TABLE 4, the symbol "○" means that the occurrence of chipping in the cured product was not almost detected; and the symbol "⊙" means that the occurrence of chipping in the cured product was not particularly detected.

The cured product of Example 3 was tested for the heat resistance by the following method.

[Evaluation Test for Heat Resistance of Cured Product]

Figure 2:
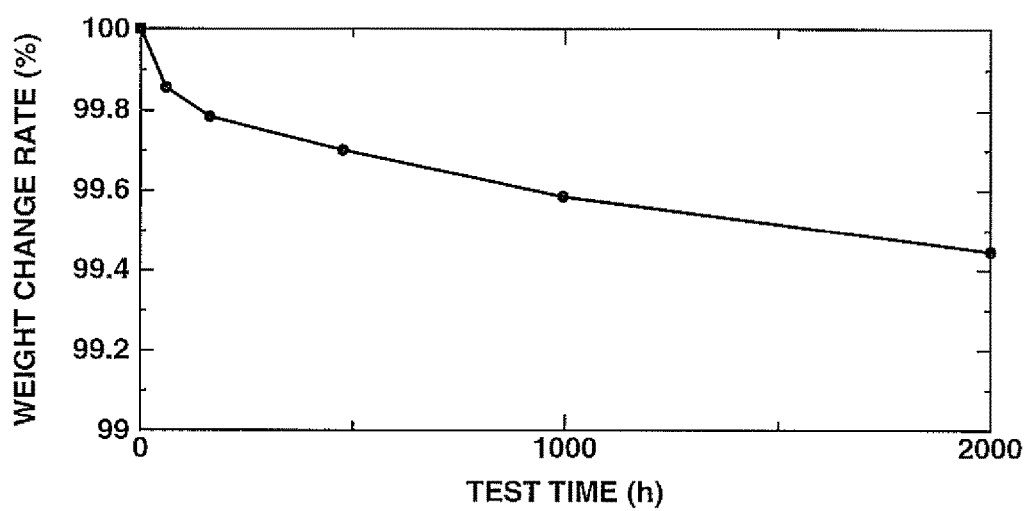
FIG. 2 is a diagram showing heat resistance test results of cured products in Experiment 3.

The cured product was heated at 250° C. until the lapse of 2000 hours. The weight of the cured product before and after the heating was measured to evaluate the rate of weight change of the cured product relative to the heating time. The evaluation test result is shown in FIG. 2.

Examples 1-28 and Comparative Examples 1-4

As shown in TABLE 1, the curable resin compositions of Examples 1-28 falling within the scope of the present invention and the curable resin compositions of Comparative Examples 1-4 falling outside the scope of the present invention were respectively formed and cured. The sizes and foaming evaluation results of the resulting cured products are shown in TABLE 1. The respective curable resin compositions for evaluation were each prepared by mixing any of the polysiloxane compounds (A-a) to (A-f) synthesized in Synthesis Examples 1-6, the specific silica component and the specific additive component in amounts as shown in TABLE 1.

Comparative Example 5

As shown in TABLE 1, the curable resin composition of Comparative Example 5 falling outside the scope of the present invention was formed. However, the cured product was not obtained in bulk form, but was obtained in powder form, after the heat treatment.

Reference Example 1

As shown in TABLE 1, the curable resin composition of Reference Example 1, which consisted only of the polysiloxane compound (A-a), was formed and cured into a film shape of 100 mm diameter and 0.1 mm thickness.

TABLE 1

| | Polysiloxane | | Silica | | | Additive | | Cured product | | |
|---|---|---|---|---|---|---|---|---|---|---|
| | kind | pts. mass | kind | pH | pts. mass | kind | pts. mass | Forming process | size (mm, t: thickness) | foaming |
| Ex. 1 | A-a | 17 | SO-C2 | 4.8 | 83 | — | — | cast molding | φ21 × t15 | not occur |
| Ex. 2 | A-a | 25 | SO-C2 | 4.8 | 75 | — | — | cast molding | φ21 × t15 | not occur |
| Ex. 3 | A-a | 10 | FB-20D | 6.0 | 90 | — | — | cast molding | φ21 × t15 | not occur |
| Ex. 4 | A-a | 10 | FB-20D | 6.0 | 90 | #30L | 0.1 | compression molding | 40 × 60 × t4 | not occur |
| Ex. 5 | A-a | 10 | FB-20D | 6.0 | 90 | #30L | 0.1 | compression molding | 100 × 100 × t2 | not occur |
| Ex. 6 | A-a | 6 | ML-902SK | 5.5 | 94 | — | — | cast molding | φ21 × t15 | not occur |
| Ex. 7 | A-a | 10 | ML-902SK | 5.5 | 90 | — | — | cast molding | φ21 × t15 | not occur |
| Ex. 8 | A-a | 15 | ML-902SK | 5.5 | 85 | #30L | 0.1 | transfer molding | 10 × 70 × t3 | not occur |
| Ex. 9 | A-a | 15 | mixed silica B-a | 5.4 | 85 | #30L | 0.1 | transfer molding | 10 × 70 × t3 | not occur |
| Ex. 10 | A-a | 15 | mixed silica B-a | 5.4 | 85 | #30L | 0.1 | transfer molding | 10 × 70 × t3 | not occur |
| Ex. 11 | A-a | 12 | mixed silica B-a | 5.4 | 88 | #30L | 0.1 | transfer molding | 10 × 70 × t3 | not occur |
| Ex. 12 | A-a | 10 | mixed silica B-a | 5.4 | 90 | #30L | 0.1 | transfer molding | 10 × 70 × t3 | not occur |
| Ex. 13 | A-a | 12 | mixed silica B-a | 5.4 | 88 | #30L | 0.1 | transfer molding | 70 × 70 × t3 | not occur |
| Ex. 14 | A-a | 12 | mixed silica B-a | 5.4 | 88 | #30L | 0.1 | transfer molding | 13 × 120 × t3 | not occur |
| Ex. 15 | A-a | 12 | mixed silica B-a | 5.4 | 88 | #30L | 0.1 | transfer molding | 13 × 125 × t1.6 | not occur |
| Ex. 16 | A-a | 12 | mixed silica B-a | 5.4 | 88 | #30L | 0.1 | transfer molding | φ90 × t3 | not occur |
| Ex. 17 | A-b | 10 | ML-902SK | 5.5 | 90 | — | — | cast molding | φ21 × t15 | not occur |
| Ex. 18 | A-c | 10 | ML-902SK | 5.5 | 90 | — | — | cast molding | φ21 × t15 | not occur |
| Ex. 19 | A-d | 12 | mixed silica B-a | 5.4 | 88 | #30L | 0.1 | cast molding | φ21 × t15 | not occur |
| Ex. 20 | A-e | 12 | mixed silica B-a | 5.4 | 88 | #30L | 0.1 | cast molding | φ21 × t15 | not occur |
| Ex. 21 | A-f | 12 | mixed silica B-a | 5.4 | 88 | #30L | 0.1 | cast molding | φ21 × t15 | not occur |
| Ex. 22 | A-a | 12 | mixed silica B-a | 5.4 | 88 | #30L CP-102 | 0.1 1 | transfer molding | 10 × 70 × t3 | not occur |
| Ex. 23 | A-a | 12 | mixed silica B-a | 5.4 | 88 | #30L | 0.1 | transfer molding | 10 × 70 × t3 | not occur |
| Ex. 24 | A-a | 12 | mixed silica B-a | 5.4 | 88 | #30L | 0.1 | transfer molding | 10 × 70 × t3 | not occur |
| Ex. 25 | A-a | 10 | SE-15K | 5.9 | 90 | — | — | cast molding | φ21 × t15 | not occur |
| Ex. 26 | A-a | 10 | MSR-LV24 | 5.4 | 90 | — | — | cast molding | φ21 × t15 | not occur |
| Ex. 27 | A-a | 10 | MSR-5100 | 5.3 | 90 | — | — | cast molding | φ21 × t15 | not occur |
| Ex. 28 | A-a | 10 | EMIX-CER | 5.4 | 90 | — | — | cast molding | φ21 × t15 | not occur |
| Comp. Ex. 1 | A-a | 100 | — | — | 0 | — | — | cast molding | φ21 × t15 | occur |
| Comp. Ex. 2 | A-a | 33 | SO-C2 | 4.8 | 67 | — | — | cast molding | φ21 × t15 | occur |
| Comp. Ex. 3 | A-a | 25 | SC2500-SQ | 6.3 | 75 | — | — | cast molding | φ21 × t15 | occur |

TABLE 1-continued

| | Composition | | | | | | | Cured product | |
|---|---|---|---|---|---|---|---|---|---|
| | Polysiloxane | | Silica | | | Additive | | | |
| | kind | pts. mass | kind | pH | pts. mass | kind | pts. mass | Forming process | size (mm, t: thickness) | foaming |
| Comp. Ex. 4 | A-a | 17 | SC5500-SQ | 6.8 | 83 | — | — | cast molding | φ21 × t15 | occur |
| Comp. Ex. 5 | A-a | 2 | ML-902SK | 5.5 | 98 | — | — | cast molding | — | — |
| Ref. Ex. 1 | A-a | 100 | — | — | 0 | — | — | spin coating | φ100 × t0.1 | not occur |

[Silica]
SO-C2: deflagration silica, median size: 0.5 μm, manufactured by Admatechs;
FB-20D: natural fused silica, median size: 23 μm, manufactured by Denka Company Limited.;
ML-902SK: synthetic fused silica, median size: 24 μm, manufactured by Tokuyama Corporation;
SC2500-SQ: deflagration silica, median size: 0.5 μm, manufactured by Admatechs;
SC5500-SQ: deflagration silica, median size: 1.5 μm, manufactured by Admatechs;
SE-15K: synthetic fused silica, median size: 18 μm, manufactured by Tokuyama Corporation;
MSR-LV24: natural fused silica, median size: 23 μm, manufactured by Tatsumori Ltd.;
MSR-5100: natural fused silica, median size: 16 μm, manufactured by Tatsumori Ltd.;
EMIX-CER: synthetic fused silica, median size: 20 μm, manufactured by Tatsumori Ltd.;
mixed silica: ML-902SK/SO-C2 = 95/5 (pts. mass)
[Additive]
30L: carbon black manufactured by Mitsubishi Chemistry Corporation;
CP-102: fumed silica manufactured by Tokuyama Corporation
[Compression Molding Process]
Equipment: 26-ton hydraulic molding machine manufactured by Toho Seisakusho Co., Ltd.;
Molding conditions: 250° C., 50 MPa (Example 4) or 25 MPa (Example 5), 15 min.
[Transfer Molding Process]
Equipment: transfer molding machine MF-0 manufactured by Marushichi Engineering Co., Ltd.;
Molding conditions: 200° C. (Examples 8-9) or 180° C. (Examples 10-16 and 22-24), 6.9 MPa, 15 min.
[Spiral Flow of Curable Resin Composition]
Measurement conditions: 180° C., 6.9 MPa, 3 min.;
Measured value: 80 cm (Examples 11 and 13-16), 8 cm (Example 23), 134 cm (Example 24)

In Comparative Example 1 and Reference Example 1 of TABLE 1, it is shown the case where the cured products were obtained using only the polysiloxane compound (A-a). Foaming was seen in the cured product of Comparative Example 1 having a relatively large size of 21 mm diameter and 15 mm thickness. By contrast, no foaming was seen in the cured product of Reference Example 1 having a thin film shape of 100 mm diameter and 0.1 mm thickness. In the case where the cured products were obtained with a diameter of 21 mm and a thickness of 15 mm, foaming was seen in all of the cured products of Comparative Examples 1-4; whereas foaming was not seen in any of the cured products of Examples 1-3, 6-7, 17-21 and 25-28. In the case where the cured product was obtained from the curable resin composition in which the pigment was added as the additive, foaming was not also seen in the cured product as shown in Examples 4-5, 8-16 and 19-24. As shown in Example 22, foaming was not also seen in the cured product in the case where the cured product was obtained from the curable resin composition in which the anti-blocking agent was added as the additive. It is apparent from these results that the curable resin composition falling within the scope of the present invention was, even when formed in a large thickness and large area, free of the occurrence of foaming.

In the case of using the silica components whose extract waters were the same in pH, there was a difference between the occurrence and non-occurrence of foaming in the cured products depending on the polysiloxane-to-silica component ratios of the curable resin compositions as shown in Examples 1-2 and Comparative Example 2.

In the case where the polysiloxane-to-silica component ratios of the curable resin compositions were the same, on the other hand, foaming was not seen in the cured product using the silica component whose extract water was low in pH; whereas foaming was seen in the cured product using the silica component whose extract water was high in pH, as shown in Examples 1-2 and Comparative Examples 3-4.

As shown in Examples 1-28, foaming was not seen in the cured products in the case where the cured products were obtained from the curable resin compositions in which the structural units and component ratios of the polysiloxane compounds were different.

Further, foaming was not seen in the cured products in the case where the cured products were obtained by the adoption of any of cast molding process, compression molding process and transfer molding process as shown in Examples 1-28.

Examples 8-16

Evaluation of Surface Smoothness of Cured Product

Among the examples of TABLE 1, evaluations were made as to the surface roughness of the cured products obtained by transfer molding the curable resin compositions (Examples 8-16). The evaluation results are shown in TABLE 2.

TABLE 2

| | Composition | | | | | | Transfer molding | Cured product | |
|---|---|---|---|---|---|---|---|---|---|
| | Polysiloxane | | Silica | | | Additive | | | |
| | kind | pts. mass | kind | pH | pts. mass | kind | pts. mass | temperature (° C.) | size (mm, t: thickness) | surface smoothness |
| Ex. 8 | A-a | 15 | ML-902SK | 5.5 | 85 | #30L | 0.1 | 200 | 10 × 70 × t3 | ○ |
| Ex. 9 | A-a | 15 | mixed silica B-a | 5.4 | 85 | #30L | 0.1 | 200 | 10 × 70 × t3 | ⊚ |
| Ex. 10 | A-a | 15 | mixed silica B-a | 5.4 | 85 | #30L | 0.1 | 180 | 10 × 70 × t3 | ⊚ |
| Ex. 11 | A-a | 12 | mixed silica B-a | 5.4 | 88 | #30L | 0.1 | 180 | 10 × 70 × t3 | ⊚ |
| Ex. 12 | A-a | 10 | mixed silica B-a | 5.4 | 90 | #30L | 0.1 | 180 | 10 × 70 × t3 | ⊚ |
| Ex. 13 | A-a | 12 | mixed silica B-a | 5.4 | 88 | #30L | 0.1 | 180 | 70 × 70 × t3 | ⊚ |
| Ex. 14 | A-a | 12 | mixed silica B-a | 5.4 | 88 | #30L | 0.1 | 180 | 13 × 120 × t3 | ⊚ |
| Ex. 15 | A-a | 12 | mixed silica B-a | 5.4 | 88 | #30L | 0.1 | 180 | 13 × 125 × t1.6 | ⊚ |
| Ex. 16 | A-a | 12 | mixed silica B-a | 5.4 | 88 | #30L | 0.1 | 180 | φ90 × t3 | ⊚ |

[Silica]
SO-C2: deflagration silica, median size: 0.5 µm, manufactured by Admatechs;
ML-902SK: synthetic fused silica, median size: 24 µm, manufactured by Tokuyama Corporation;
mixed silica: ML-902SK/SO-C2 = 95/5 (pts. mass)
[Additive]
30L: carbon black manufactured by Mitsubishi Chemistry Corporation;
[Molding Process: Transfer Molding]
Equipment: transfer molding machine MF-0 manufactured by Marushichi Engineering Co., Ltd.;
Molding conditions: 6.9 MPa, 15 min.

As shown in Examples 8 and 9 of TABLE 2, the cured product had better surface roughness when mixed silica (B-a) containing 95 mass % of synthetic fused silica (median size: 24 µm, trade name: ML-902SK) and 5 mass % of deflagration silica (median size: 0.5 µm, trade name: SO-C2) was used as the silica component than when only synthetic fused silica (median size: 24 µm, trade name: ML-902SK) was used as the silica component. Even though the molding temperature was lower in Example 10 than in Example 8, the cured product of Example 10 using the mixed silica (B-a) had better surface roughness. It is apparent from these results that, as compared to the case where only large particle size silica was used as the silica component, the curing speed of the curable resin composition was increased to allow improvement of mold releasability and decrease of forming temperature by the addition of small particle size silica.

The cured products of Examples 10-12 had very good surface smoothness even though the component ratios of the curable resin compositions were varied. The curing speed increasing effects of the addition of small particle size silica were confirmed by these results. Similarly, the same effects were confirmed even when the sizes of the cured products were varied.

Examples 11 and 22

Evaluation of Adhesion Resistance and Shape Maintenance of Tablets

Among the examples of TABLE 1, evaluations were made as to the adhesion resistance and shape maintenance of the tablets obtained by transfer molding the curable resin compositions (Examples 11 and 22). The evaluation results are shown in TABLE 3.

TABLE 3

| | Composition | | | | | | | Tablet (40 g, φ38 mm) | |
|---|---|---|---|---|---|---|---|---|---|
| | Polysiloxane | | Silica | | | Additive | | | |
| | kind | pts. mass | kind | pH | pts. mass | kind | pts. mass | suppression of adhesion | shape maintenance |
| Ex. 11 | A-a | 12 | mixed silica B-a | 5.4 | 88 | #30L | 0.1 | ○ | ○ |
| Ex. 22 | A-a | 12 | mixed silica B-a | 5.4 | 88 | #30L CP-102 | 0.1 1 | ⊚ | ⊚ |

[Silica]
SO-C2: deflagration silica, median size: 0.5 µm, manufactured by Admatechs;
ML-902SK: synthetic fused silica, median size: 24 µm, manufactured by Tokuyama Corporation;
mixed silica: ML-902SK/SO-C2 = 95/5 (pts. mass)
[Additive]
30L: carbon black manufactured by Mitsubishi Chemistry Corporation;
CP-102: fumed silica manufactured by Tokuyama Corporation
[Molding Process: Transfer Molding]
Equipment: transfer molding machine MF-0 manufactured by Marushichi Engineering Co., Ltd.;
Molding conditions: 6.9 MPa, 15 min.

As shown in Examples 11 and 22 of TABLE 3, the tablet in which the anti-blocking agent was used as the additive had better tablet-to-tablet adhesion resistance and shape maintenance than the tablet in which the anti-blocking agent was not used as the additive.

Examples 11, 13-16 and 23-24

Evaluation of Surface Smoothness and Chipping Non-Occurrence of Cured Product

Among the examples of TABLE 1, evaluations were made as to the surface smoothness and chipping non-occurrence of the cured products obtained by transfer molding the curable resin compositions (i.e. in Examples 11, 13-16 and 23-24). The evaluation results are shown in TABLE 4.

TABLE 4

| | Composition | | | | | | | | Cured product | |
| | Polysiloxane | | Silica | | | Additive | | Spiral | | surface | non- |
| | kind | pts. mass | kind | pH | pts. mass | kind | pts. mass | flow (cm) | size (mm, t: thickness) | rough-ness | occurrence of chipping |
|---|---|---|---|---|---|---|---|---|---|---|---|
| Ex. 11 | A-a | 12 | mixed silica B-a | 5.4 | 88 | #30L | 0.1 | 80 | 10 × 70 × t3 | ◎ | ◎ |
| Ex. 13 | A-a | 12 | mixed silica B-a | 5.4 | 88 | #30L | 0.1 | 80 | 70 × 70 × t3 | ◎ | ◎ |
| Ex. 14 | A-a | 12 | mixed silica B-a | 5.4 | 88 | #30L | 0.1 | 80 | 13 × 120 × t3 | ◎ | ◎ |
| Ex. 15 | A-a | 12 | mixed silica B-a | 5.4 | 88 | #30L | 0.1 | 80 | 13 × 125 × t1.6 | ◎ | ◎ |
| Ex. 16 | A-a | 12 | mixed silica B-a | 5.4 | 88 | #30L | 0.1 | 80 | φ90 × t3 | ◎ | ◎ |
| Ex. 23 | A-a | 12 | mixed silica B-a | 5.4 | 88 | #30L | 0.1 | 8 | 10 × 70 × t3 | ◎ | ○ |
| Ex. 24 | A-a | 12 | mixed silica B-a | 5.4 | 88 | #30L | 0.1 | 134 | 10 × 70 × t3 | ○ | ◎ |

[Silica]
SO-C2: deflagration silica, median size: 0.5 μm, manufactured by Admatechs;
ML-902SK: synthetic fused silica, median size: 24 μm, manufactured by Tokuyama Corporation;
mixed silica: ML-902SK/SO-C2 = 95/5 (pts. mass)
[Additive]
30L: carbon black manufactured by Mitsubishi Chemistry Corporation;
[Molding Process: Transfer Molding]
Equipment: transfer molding machine MF-0 manufactured by Marushichi Engineering Co., Ltd.;
Molding conditions: 180° C., 6.9 MPa, 15 min.
[Spiral Flow of Curable Resin Composition]
Measurement conditions: 180° C., 6.9 MPa, 3 min.

As shown in Examples 11, 13-16 and 23 of TABLE 4, the occurrence of chipping in the cured product was less detected when the spiral flow of the curable resin composition was adjusted to 80 cm than when the spiral flow of the curable resin composition was adjusted to 8 cm, even though where the component ratios of the curable resin compositions were the same.

Further, the surface smoothness of the cured product was better when the spiral flow of the curable resin composition was adjusted to 80 cm than when the spiral flow of the curable resin composition was adjusted to 134 cm, even though the component ratios of the curable resin compositions were the same, as shown in Examples 11, 13-16 and 24 of TABLE 4.

The cured products of Examples 11 and 13-16, each of which was obtained by adjusting the spiral flow of the curable resin composition to 80 cm, had particularly no chipping occurrence and very good surface smoothness even though varied in size as shown in TABLE 4.

Furthermore, the cured product of Example 3 had a weight change rate of −0.55 mass % even after heated at 250° C. for a long term of 2000 hours and showed substantially no weight decrease as shown in FIG. 2.

What is claimed is:

1. A curable resin composition comprising at least:
component (A-1): a polysiloxane compound having, in a molecule thereof, at least two functional groups selected from the group consisting of silanol groups and alkoxysilyl groups; and
component (B): silica whose extract water has a pH of 6.1 or lower at 25° C., the extract water being obtained by stirring 10 g of the silica in 200 ml of purified water at 80±3° C. for 1 hour to provide a sample liquid, and then, cooling the sample liquid to room temperature, wherein
the amount of the component (B) relative to the total amount of the components (A-1) and (B) is in a range of 70 to 97 mass %; and
the total amount of silanol and alkoxysilyl groups in the component (A-1) is in a range of 1 to 15 mmol/g.

2. The curable resin composition according to claim 1, wherein the polysiloxane compound contained as the component (A-1) has at least a structural unit of the general formula [1]

$$[R^1{}_m SiO_{n/2}] \qquad [1]$$

where $R^1$ each independently represents a hydrogen atom, a $C_1$-$C_{10}$ linear alkyl group, a $C_3$-$C_{10}$ branched alkyl group, a $C_3$-$C_{10}$ cyclic alkyl group, a $C_2$-$C_{10}$ linear alkenyl group, a $C_3$-$C_{10}$ branched alkenyl group, a $C_3$-$C_{10}$ cyclic alkenyl group or a $C_5$-$C_{10}$ aryl group; a part or all of hydrogen atoms of the alkyl group, the alkenyl group or the aryl group may be substituted by a halogen atom; a part of carbon atoms of the alkyl group, the alkenyl group or the aryl group may be replaced by at least one kind selected from the group consisting of a nitrogen atom, an oxygen atom and a silicon atom; the halogen atom is at least one kind selected from the group consisting of a fluorine atom, a chlorine atom, a bromine atom and an iodine atom; when there are a plurality of $R^1$, $R^1$ can be of the same kind or different kinds; an oxygen atom of the structural unit of the general formula [1] is a siloxane bond-forming oxygen atom or a hydroxyl oxygen atom; and m and n each independently represent an integer of 1 to 4 and satisfy a relationship of m+n=4.

3. The curable resin composition according to claim 2, wherein $R^1$ is a $C_1$-$C_{10}$ linear alkyl group, a $C_3$-$C_{10}$ branched alkyl group, a $C_3$-$C_{10}$ cyclic alkyl group or a $C_5$-$C_{10}$ aryl group.

4. The curable resin composition according to claim 2, wherein $R^1$ is a methyl group or a phenyl group.

5. The curable resin composition according to claim 2, wherein the polysiloxane compound contained as the component (A-1) has the structural unit of the general formula [1] and a structural unit of the general formula [2]

$$[SiO_{4/2}] \qquad [2]$$

where an oxygen atom of the structural unit of the general formula [2] is a siloxane bond-forming oxygen atom or a hydroxyl oxygen atom.

6. The curable resin composition according to claim 1, wherein the component (B) contains two or more kinds of silica.

7. The curable resin composition according to claim 6, wherein the two or more kinds of silica are selected from the group consisting of crystalline silica, natural fused silica, synthetic fused silica, deflagration silica, fumed silica, sol-gel silica, flame fused silica and precipitated silica.

8. The curable resin composition according to claim 1, wherein the silica contained as the component (B) has a median particle size of 0.02 to 500 μm.

9. The curable resin composition according to claim 1, wherein the silica contained as the component (B) shows a plurality of frequency peaks in particle size distribution analysis.

10. The curable resin composition according to claim 1, wherein the silica contained as the component (B) includes silica particles having a particle size of 3 μm or smaller.

11. The curable resin composition according to claim 1, wherein the silica contained as the component (B) is chemically unmodified.

12. The curable resin composition according to claim 1, further comprising at least one kind selected from the group consisting of an inorganic filler, a heat-resistant resin, a mold release agent, a pigment, a flame retardant, a curing catalyst and an anti-blocking agent.

13. The curable resin composition according to claim 12, further comprising a coupling agent.

14. The curable resin composition according to claim 1, wherein the curable resin composition has a spiral flow length of 5 to 180 cm as determined according to Japan Electrical Insulating and Advanced Performance Materials Industrial Association Standard T901 under the conditions of a temperature of 180° C., a molding pressure of 6.9 MPa and a molding time of 3 minutes.

15. A method for preparing the curable resin composition according to claim 1, comprising mixing the component (A-1) with the component (B) such that the amount of the component (B) relative to the total amount of the component (A-1) and the component (B) is in a range of 70 to 97 mass %.

16. The method for preparing the curable resin composition according to claim 15, wherein the curable resin composition is prepared by mixing the component (A-1), the component (B) and at least one kind selected from the group consisting of an inorganic filler, a heat-resistant resin, a mold release agent, a pigment, a flame retardant, a curing catalyst and an anti-blocking agent.

17. The method for preparing the curable resin composition according to claim 15, wherein the curable resin composition is prepared by mixing the component (A-1), the component (B), at least one kind selected from the group consisting of an inorganic filler, a heat-resistant resin, a mold release agent, a pigment, a flame retardant, a curing catalyst and an anti-blocking agent, and a coupling agent.

18. A tableted product of the curable resin composition according to claim 1.

19. A cured product of the curable resin composition according to claim 1.

20. The cured product according to claim 19, wherein the cured product has a thickness of 1 mm or greater.

21. The cured product according to claim 19, wherein the cured product has a thickness of 2 mm or greater.

22. The cured product according to claim 19, wherein the cured product has a thickness of 4 mm or greater.

23. A semiconductor device comprising:
a cured product of a curable resin composition; and
at least a semiconductor element that is encapsulated by the cured product, the curable resin composition comprising at least:
component (A-1): a polysiloxane compound having, in a molecule thereof, at least two functional groups selected from the group consisting of silanol groups and alkoxysilyl groups; and
component (B): silica whose extract water has a pH of 6.1 or lower at 25° C., the extract water being obtained by stirring 10 g of the silica in 200 ml of purified water at 80±3° C. for 1 hour to provide a sample liquid, and then, cooling the sample liquid to room temperature, wherein
the amount of the component (B) relative to the total amount of the components (A-1) and (B) is in a range of 70 to 97 mass %.

24. The semiconductor device according to claim 23, wherein the semiconductor element is a power semiconductor element.

25. A method of encapsulating a semiconductor element, comprising:
curing a curable resin composition, the curable resin composition comprising at least:
component (A-1): a polysiloxane compound having, in a molecule thereof, at least two functional groups selected from the group consisting of silanol groups and alkoxysilyl groups; and
component (B): silica whose extract water has a pH of 6.1 or lower at 25° C., the extract water being obtained by stirring 10 g of the silica in 200 ml of purified water at 80±3° C. for 1 hour to provide a sample liquid, and then, cooling the sample liquid to room temperature, wherein
the amount of the component (B) relative to the total amount of the components (A-1) and (B) is in a range of 70 to 97 mass %.

26. The curable resin composition according to claim 1, wherein the curable resin composition is a condensation curable resin composition.

27. The semiconductor device according to claim 23, wherein the polysiloxane compound contained as the component (A-1) has at least a structural unit of the general formula [1]

$$[R^1{}_m SiO_{n/2}] \quad [1]$$

where $R^1$ each independently represents a hydrogen atom, a $C_1$-$C_{10}$ linear alkyl group, a $C_3$-$C_{10}$ branched alkyl group, a $C_3$-$C_{10}$ cyclic alkyl group, a $C_2$-$C_{10}$ linear alkenyl group, a $C_3$-$C_{10}$ branched alkenyl group, a $C_3$-$C_{10}$ cyclic alkenyl group or a $C_5$-$C_{10}$ aryl group; a part or all of hydrogen atoms of the alkyl group, the alkenyl group or the aryl group may be substituted by a halogen atom; a part of carbon atoms of the alkyl group, the alkenyl group or the aryl group may be replaced by at least one kind selected from the group consisting of a nitrogen atom, an oxygen atom and a silicon atom; the halogen atom is at least one kind selected from the group consisting of a fluorine atom, a chlorine atom, a bromine atom and an iodine atom; when there are a plurality of $R^1$, $R^1$ can be of the same kind or different kinds; an oxygen atom of the structural unit of the general formula [1] is a siloxane bond-forming oxygen atom or a hydroxyl oxygen atom; and m and n each independently represent an integer of 1 to 4 and satisfy a relationship of m+n=4.

28. The semiconductor device according to claim 27, wherein $R^1$ is a $C_1$-$C_{10}$ linear alkyl group, a $C_3$-$C_{10}$ branched alkyl group, a $C_3$-$C_{10}$ cyclic alkyl group or a $C_5$-$C_{10}$ aryl group.

29. The semiconductor device according to claim 27, wherein $R^1$ is a methyl group or a phenyl group.

30. The semiconductor device according to claim 27, wherein the polysiloxane compound contained as the component (A-1) has the structural unit of the general formula [1] and a structural unit of the general formula [2]

$$[SiO_{4/2}] \quad [2]$$

where an oxygen atom of the structural unit of the general formula [2] is a siloxane bond-forming oxygen atom or a hydroxyl oxygen atom.

31. The semiconductor device according to claim 23, wherein the total amount of silanol and alkoxysilyl groups in the component (A-1) is in a range of 1 to 15 mmol/g.

32. The semiconductor device according to claim 23, wherein the component (B) contains two or more kinds of silica.

33. The semiconductor device according to claim 32, wherein the two or more kinds of silica are selected from the group consisting of crystalline silica, natural fused silica, synthetic fused silica, deflagration silica, fumed silica, sol-gel silica, flame fused silica and precipitated silica.

34. The semiconductor device according to claim 23, wherein the silica contained as the component (B) has a median particle size of 0.02 to 500 μm.

35. The semiconductor device according to claim 23, wherein the silica contained as the component (B) shows a plurality of frequency peaks in particle size distribution analysis.

36. The semiconductor device according to claim 23, wherein the silica contained as the component (B) includes silica particles having a particle size of 3 μm or smaller.

37. The semiconductor device according to claim 23, wherein the silica contained as the component (B) is chemically unmodified.

38. The semiconductor device according to claim 23, wherein the curable resin composition further comprises at least one kind selected from the group consisting of an inorganic filler, a heat-resistant resin, a mold release agent, a pigment, a flame retardant, a curing catalyst and an anti-blocking agent.

39. The semiconductor device according to claim 38, wherein the curable resin composition further comprises a coupling agent.

40. The semiconductor device according to claim 23, wherein the curable resin composition has a spiral flow length of 5 to 180 cm as determined according to Japan Electrical Insulating and Advanced Performance Materials Industrial Association Standard T901 under the conditions of a temperature of 180° C., a molding pressure of 6.9 MPa and a molding time of 3 minutes.

41. The semiconductor device according to claim 23, wherein the curable resin composition is a condensation curable resin composition.

42. The method according to claim 25, wherein the polysiloxane compound contained as the component (A-1) has at least a structural unit of the general formula [1]

$$[R^1{}_m SiO_{n/2}] \quad [1]$$

where $R^1$ each independently represents a hydrogen atom, a $C_1$-$C_{10}$ linear alkyl group, a $C_3$-$C_{10}$ branched alkyl group, a $C_3$-$C_{10}$ cyclic alkyl group, a $C_2$-$C_{10}$ linear lkenyl group, a $C_3$-$C_{10}$ branched alkenyl group, a $C_3$-$C_{10}$ cyclic alkenyl group or a $C_5$-$C_{10}$ aryl group; a part or all of hydrogen atoms of the alkyl group, the alkenyl group or the aryl group may be substituted by a halogen atom; a part of carbon atoms of the alkyl group, the alkenyl group or the aryl group may be replaced by at least one kind selected from the group consisting of a nitrogen atom, an oxygen atom and a silicon atom; the halogen atom is at least one kind selected from the group consisting of a fluorine atom, a chlorine atom, a bromine atom and an iodine atom; when there are a plurality of $R^1$, $R^1$ can be of the same kind or different kinds; an oxygen atom of the structural unit of the general formula [1] is a siloxane bond-forming oxygen atom or a hydroxyl oxygen atom; and m and n each independently represent an integer of 1 to 4 and satisfy a relationship of m+n=4.

43. The method according to claim 42, wherein $R^1$ is a $C_1$-$C_{10}$ linear alkyl group, a $C_3$-$C_{10}$ branched alkyl group, a $C_3$-$C_{10}$ cyclic alkyl group or a $C_5$-$C_{10}$ aryl group.

44. The method according to claim 42, wherein $R^1$ is a methyl group or a phenyl group.

45. The method according to claim 42, wherein the polysiloxane compound contained as the component (A-1) has the structural unit of the general formula [1] and a structural unit of the general formula [2]

$$[SiO_{4/2}] \quad [2]$$

where an oxygen atom of the structural unit of the general formula [2] is a siloxane bond-forming oxygen atom or a hydroxyl oxygen atom.

46. The method according to claim 25, wherein the total amount of silanol and alkoxysilyl groups in the component (A-1) is in a range of 1 to 15 mmol/g.

47. The method according to claim 25, wherein the component (B) contains two or more kinds of silica.

48. The method according to claim 47, wherein the two or more kinds of silica are selected from the group consisting of crystalline silica, natural fused silica, synthetic fused silica, deflagration silica, fumed silica, sol-gel silica, flame fused silica and precipitated silica.

49. The method according to claim 25, wherein the silica contained as the component (B) has a median particle size of 0.02 to 500 μm.

50. The method according to claim 25, wherein the silica contained as the component (B) shows a plurality of frequency peaks in particle size distribution analysis.

51. The method according to claim 25, wherein the silica contained as the component (B) includes silica particles having a particle size of 3 µm or smaller.

52. The method according to claim 25, wherein the silica contained as the component (B) is chemically unmodified.

53. The method according to claim 25, wherein the curable resin composition further comprises at least one kind selected from the group consisting of an inorganic filler, a heat-resistant resin, a mold release agent, a pigment, a flame retardant, a curing catalyst and an anti-blocking agent.

54. The method according to claim 53, wherein the curable resin composition further comprises a coupling agent.

55. The method according to claim 25, wherein the curable resin composition has a spiral flow length of 5 to 180 cm as determined according to Japan Electrical Insulating and Advanced Performance Materials Industrial Association Standard T901 under the conditions of a temperature of 180° C., a molding pressure of 6.9 MPa and a molding time of 3 minutes.

56. The method according to claim 25, wherein the curable resin composition is a condensation curable resin composition.

* * * * *